United States Patent
Irino et al.

(10) Patent No.: US 6,898,228 B2
(45) Date of Patent: May 24, 2005

(54) SEMICONDUCTOR LASER DEVICE, SEMICONDUCTOR LASER MODULE, RAMAN AMPLIFIER USING THE DEVICE OR MODULE, AND METHOD FOR FORMING A SUITABLE CURRENT BLOCKING LAYER

(75) Inventors: Satoshi Irino, Tokyo (JP); Naoki Tsukiji, Tokyo (JP); Junji Yoshida, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 253 days.

(21) Appl. No.: 10/291,513

(22) Filed: Nov. 12, 2002

(65) Prior Publication Data

US 2003/0091300 A1 May 15, 2003

(30) Foreign Application Priority Data

Nov. 13, 2001 (JP) ........................................ 2001-347825

(51) Int. Cl.[7] .................................................. H01S 5/00
(52) U.S. Cl. ............................... 372/46; 372/45; 372/96
(58) Field of Search ................................ 372/46, 45, 96

(56) References Cited

U.S. PATENT DOCUMENTS

| | | | | |
|---|---|---|---|---|
| 4,622,674 A | * | 11/1986 | Mito | 372/45 |
| 5,343,486 A | * | 8/1994 | Itaya et al. | 372/43 |
| 6,384,963 B2 | | 5/2002 | Ackerman et al. | 359/334 |
| 6,643,308 B2 | * | 11/2003 | Tsukiji et al. | 372/46 |
| 6,704,342 B1 | * | 3/2004 | Funabashi et al. | 372/96 |
| 2003/0021314 A1 | * | 1/2003 | Yoshida et al. | 372/45 |
| 2003/0043878 A1 | * | 3/2003 | Funabashi et al. | 372/96 |
| 2003/0063647 A1 | * | 4/2003 | Yoshida et al. | 372/50 |
| 2003/0068125 A1 | * | 4/2003 | Yoshida et al. | 385/27 |

* cited by examiner

Primary Examiner—MinSun Oh Harvey
Assistant Examiner—James Menefee
(74) Attorney, Agent, or Firm—Oblon, Spivak, McClelland, Maier & Neustadt, P.C.

(57) ABSTRACT

A diffraction grating is provided in the vicinity of a GRIN-SCH-MQW active layer formed between a radiation side reflection coating provided on a radiation end face of a laser beam and a reflection coating provided on a reflection end face of the laser beam, and on the radiation side reflection coating side. An n-InP layer which covers the upper part of the diffraction grating is also provided, so that the current from the p-side electrode is prevented from being injected to the vicinity of the diffraction grating by the n-InP layer. An n-InPGaAsP diffusion prevention layer forms a non-current injection area so as to suppress alloying with the p-side electrode.

20 Claims, 18 Drawing Sheets

$3200\,\mu m \geq L \geq 800\,\mu m$

SEMICONDUCTOR LASER DEVICE, SEMICONDUCTOR LASER MODULE, RAMAN AMPLIFIER USING THE DEVICE OR MODULE, AND METHOD FOR FORMING A SUITABLE CURRENT BLOCKING LAYER

BACKGROUND OF THE INVENTION

1) Field of the Invention

The present invention relates to a semiconductor laser device and a semiconductor laser module suitable for an excitation light source for erbium doped fiber amplifiers (EDFA), Raman amplifiers or the like, and a Raman amplifier using the device or the module.

2) Description of the Related Art

Recently, with popularization of various multimedia such as the Internet, a demand of increasing the capacity of the optical communication is increasing. Conventionally, in the optical communication, it is common to transmit information by a single wavelength in a band of 1310 nm or 1550 nm, which has small light absorption by an optical fiber. With this method, it is necessary to increase the number of optical fibers to be disposed in a transmission path, in order to transmit a large quantity of information, thereby causing a problem in that the cost increases, with an increase in the transmission capacity.

Therefore, a dense-wavelength division multiplexing (DWDM) communication method is now being used. In this DWDM communication method, an EDFA is mainly used, to transmit information using a plurality of wavelengths in the 1550 nm band, which is the operation band thereof. With this DWDM communication method or the WDM communication method, since one optical fiber is used to transmit a plurality of optical signals of different wavelengths simultaneously, it is not necessary to lay a new line, making it possible to remarkably increase the transmission capacity of the network.

A common WDM communication method using this EDFA has been put into practical use from 1550 nm, where flattening of gain is easy, and recently, the band has been expanded to 1580 nm, which has not been used due to a small gain coefficient. However, since a low loss band of the optical fiber is wider than a band that can be amplified by the EDFA, the spotlight has been centered on an optical amplifier operated in the band outside the EDFA band, that is, the Raman amplifier.

While the gain wavelength range of an optical amplifier using rare earth ions such as erbium as a medium is determined by an energy level of the ion, the Raman amplifier has a feature that the gain wavelength range is determined by a wavelength of an exciting light, and an optional wavelength range can be amplified by selecting the wavelength of the exciting light.

With the Raman amplification, when a strong exciting light is shone onto the optical fiber, gain appears on the long wavelength side by about 100 nm from the exciting light wavelength, due to induced Raman scattering. When a signal light in the wavelength band having this gain is shone onto the optical fiber in this excited state, this signal light is amplified. Therefore, with the WDM communication method using the Raman amplifier, the number of channels of the signal light can be further increased, as compared with the communication method using the EDFA.

FIG. 22 is a block diagram which shows the construction of a conventional Raman amplifier used in the WDM communication device. In FIG. 22, semiconductor laser modules 182a to 182d which include Fabry-Perot type semiconductor light emission elements 180a to 180d and fiber gratings 181a to 181d respectively in pair, output a laser beam, which is the source of the exciting light, to polarization multiplexing couplers 61a and 61b. The wavelengths of the laser beams output from the respective semiconductor laser modules 182a and 182b are the same, but light having a different plane of polarization is multiplexed by the polarization multiplexing coupler 61a. Similarly, the wavelengths of the laser beams output from the respective semiconductor laser modules 182c and 182d are the same, but light having a different plane of polarization is multiplexed by the polarization multiplexing coupler 61b. The polarization multiplexing couplers 61a and 61b output the polarization-coupled laser beams respectively to a WDM coupler 62. The wavelengths of the laser beams output from the polarization multiplexing couplers 61a and 61b are different from each other.

The WDM coupler 62 couples the laser beam output from the polarization multiplexing couplers 61a and 61b through an isolator 60, and outputs the coupled laser beam to an amplification fiber 64 as the exciting light, through a WDM coupler 65. A signal light to be amplified is input from a signal light input fiber 69 through an isolator 63 to the amplification fiber 64 to which the exciting light has been input, and coupled with the exciting light and subjected to the Raman amplification.

The signal light subjected to the Raman amplification in the amplification fiber 64 (amplified signal light) is input to a monitor light distribution coupler 67 through the WDM coupler 65 and an isolator 66. The monitor light distribution coupler 67 outputs a part of the amplified signal light to a control circuit 68, and outputs the remaining amplified signal light to a signal light output fiber 70 as the output laser beam.

The control circuit 68 controls the light emission state, for example, optical power of each semiconductor light emission elements 180a to 180d based on the input part of the amplified signal light, and performs feedback control so that the gain band of the Raman amplification has a flat characteristic.

FIG. 23 is a diagram which shows the schematic construction of a semiconductor laser module using the fiber grating. In FIG. 23, this semiconductor laser module 201 has a semiconductor light emission element 202 and an optical fiber 203. The semiconductor light emission element 202 has an active layer 221. The active layer 221 is provided with a light reflection surface 222 at one end, and a light radiation surface 223 at the other end. The light generated in the active layer 221 is reflected by the light reflection surface 222 and output from the light radiation surface 223.

The optical fiber 203 is arranged on the light radiation surface 223 of the semiconductor light emission element 202, and optically coupled with the light radiation surface 223. In a core 232 of the optical fiber 203, a fiber grating 233 is formed at a predetermined position from the light radiation surface 223, and the fiber grating 233 selectively reflects light of a characteristic wavelength. That is, the fiber grating 233 functions as an external resonator, and forms a resonator between the fiber grating 233 and the light reflection surface 222, and the laser beam of a specific wavelength, selected by the fiber grating 233, is amplified and output as an output laser beam 241.

In the semiconductor laser module 201 (182a to 182d), however, since a distance between the fiber grating 233 and the semiconductor light emission element 202 is long, relative intensity noise (RIN) increases due to resonance between the fiber grating 233 and the light reflection surface 222. With the Raman amplification, since the process in which amplification occurs comes early, if the intensity of the exciting light is fluctuated, the Raman gain also fluctuates. This fluctuation of the Raman gain is output directly as the fluctuation of the amplified signal intensity, causing a problem in that stable Raman amplification cannot be performed.

Here, as the Raman amplifier, there are a backward pumping system in which a signal light is excited from the rear side, like the Raman amplifier shown in FIG. 22, as well as a forward pumping system in which a signal light is excited from the front side, and a bi-directional excitation system in which a signal light is excited bi-directionally. The one mainly used as the Raman amplifier at present is the backward pumping system. The reason is that the forward pumping system in which the weak signal light progresses in the same direction together with the strong exciting light has a problem in that the excited optical power fluctuates. Therefore, it is desired to develop a stable excitation light source also applicable to the forward pumping system. That is to say, if a semiconductor laser module using the conventional fiber grating is used, there is a problem in that the applicable excitation system is limited.

The above-described semiconductor laser module 201 needs to optically couple the optical fiber 203 having the fiber grating 233 and the semiconductor light emission element 202. Since it is a mechanical optical coupling in the resonator, there is the possibility that the oscillation characteristic of the laser may change due to mechanical vibrations, causing a problem in that stable exciting light cannot be provided.

The Raman amplification in the Raman amplifier is based on a condition that a polarization direction of the signal light coincides with a polarization direction of the exciting light. That is to say, the Raman amplification has a polarization dependency of the amplified gain, and it is necessary to reduce the influence caused by a deviation between the polarization direction of the signal light and the polarization direction of the exciting light. In the instance of the backward pumping system, the signal light has no problem since the polarization becomes random during propagation. In the instance of the forward pumping system, however, the polarization dependency is strong, and it is necessary to reduce the polarization dependency by means of cross polarization multiplex, depolarization or the like of the exciting light. That is, it is necessary to reduce the degree of polarization (DOP).

Since the Raman amplification is used for the WDM communication method, the amplified gain characteristic may be changed corresponding to the number of wavelengths of the input signal light, and hence high-output operation having a wide dynamic range is required. In this instance, however, fine fluctuations actually occur in the driving current dependency of a monitor current, causing a problem in that stable optical amplification control becomes complicated or difficult. The monitor current is a current obtained when an optical output leaked from the rear end of the semiconductor laser device is received by a photodiode (PD).

For example, FIG. 24 is a diagram which shows the optical output dependency (Lo) of the monitor current (Im). In the optical output dependency of the monitor current shown in FIG. 24A, when exceeding a certain optical output, the monitor current becomes wavy with an increase in the optical output, which shows that fluctuations have occurred. In this instance, since the optical amplification control of the semiconductor laser device is performed based on the monitor current, the correspondence with the optical output becomes complicated, and as a result, the optical amplification control becomes also complicated. On the other hand, in the optical output dependency of the monitor current shown in FIG. 24B, when exceeding a certain optical output, the monitor current increases stepwise with an increase in the optical output. In this instance, the optical amplification control of the semiconductor laser device becomes unstable, since it is performed based on the monitor current.

SUMMARY OF THE INVENTION

It is an object of this invention to provide a semiconductor laser device and a semiconductor laser module suitable for an excitation light source for Raman amplifiers or the like, which eliminates fine fluctuations in a monitor current accompanying a change in the optical output, enables stable and high-gain amplification, and can reliably perform simple and easy amplification control, and a Raman amplifier using the device or the module, and another object of this invention is method for providing a semiconductor laser device having a suitable current blocking layer.

According to one aspect of the present invention, a semiconductor laser device has a diffraction grating partially provided along the vicinity of an active layer formed between a provided on a radiation end face of a laser beam and a second reflection coating provided on a reflection end face of the laser beam, and there is formed a non-current injection area in which when a laser beam having a desired oscillation longitudinal mode is output by a wavelength selection characteristic at least by the diffraction grating, the injected current to the vicinity of the periphery including the diffraction grating is suppressed, and a current blocking layer is provided at a position corresponding to the upper part of the diffraction grating, and between a contact layer provided in the upper layer of an upper cladding layer which confines the light in the active layer and an electrode to which the injected current is applied, which blocks the current directed from the electrode towards the diffraction grating with respect to the upper cladding layer, wherein a diffusion prevention layer which suppresses alloying between the current blocking layer and the electrode is provided between the current blocking layer and the electrode.

According to this aspect, the diffraction grating is partially provided in the vicinity of the active layer formed between the first reflection coating provided on the radiation end face of the laser beam and the second reflection coating provided on the reflection end face of the laser beam, and there is formed the non-current injection area in which when the laser beam having a desired oscillation longitudinal mode is output by the wavelength selection characteristic at least by the diffraction grating, the injected current to the vicinity of the periphery including the diffraction grating is suppressed, and the current blocking layer is provided at a position corresponding to the upper part of the diffraction grating, and between the contact layer provided in the upper layer of the upper cladding layer which confines the light in the active layer and the electrode to which the injected current is applied, which blocks the current directed from the electrode towards the diffraction grating with respect to the upper cladding layer. The diffusion prevention layer provided between the current blocking layer and the electrode suppresses alloying between the current blocking layer and the electrode. As a result, at the time of heat treatment which alloys between the contact layer and the electrode, the progress of alloying occuring between the current blocking layer and the electrode is reliably prevented from reaching an interface between the current blocking layer and the contact layer, the temperature rise in the vicinity of the diffraction grating is suppressed, and fine fluctuations do not occur in the monitor current with respect to a change in the optical output.

According to another aspect of the present invention, a semiconductor laser module comprises the semiconductor laser device described above, an optical fiber which waveguides the laser beam emitted from the semiconductor laser device to the outside and an optical coupling lens system which optically couples the semiconductor laser device and the optical fiber.

According to this aspect, since a semiconductor laser device which does not use a fiber grating is used, and hence a resonator in the semiconductor laser device is not physically separated, alignment of the optical axis is not necessary. As a result, assembly of the semiconductor laser module becomes easy, and the oscillation characteristic of the laser hardly changes due to mechanical vibrations, thereby a stable laser beam can be output reliably and stably.

According to still another aspect of the present invention, a Raman amplifier uses the above-described semiconductor laser device or semiconductor laser module as an excitation light source for broadband Raman amplification.

According to this aspect, the operation and effect of the respective semiconductor laser devices or the respective semiconductor laser modules described above can be exerted, by using the above-described semiconductor laser device or semiconductor laser module as an excitation light source for broadband Raman amplification.

These and other objects, features and advantages of the present invention are specifically set forth in or will become apparent from the following detailed descriptions of the invention when read in conjunction with the accompanying drawings,

DETAILED DESCRIPTIONS

The preferred embodiments of the semiconductor laser device, the semiconductor laser module and the Raman amplifier according to this invention will now be explained, with reference to the accompanying drawings.
(First Embodiment)

Figure 1:
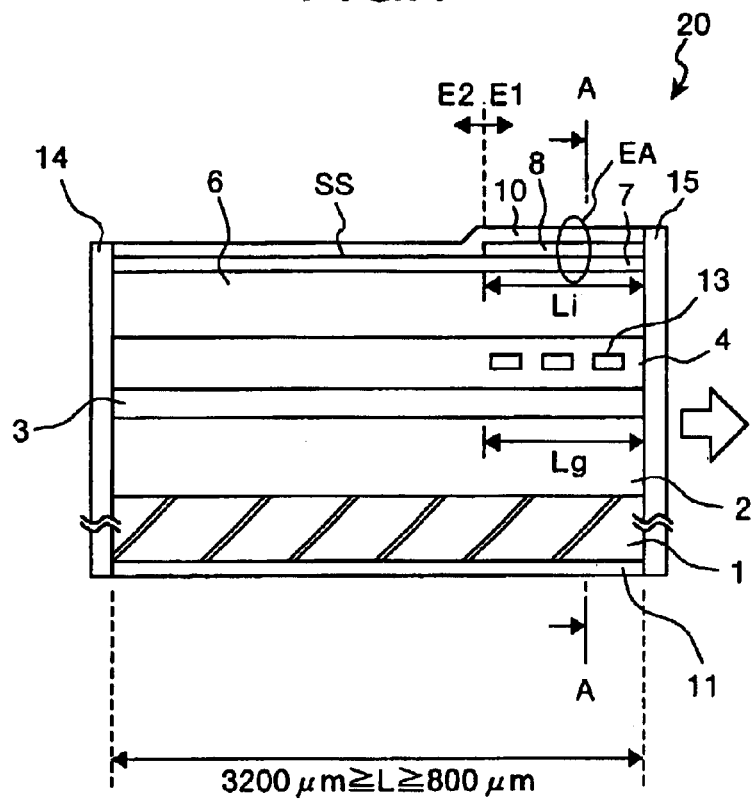
FIG. 1 is a longitudinal sectional view in the longitudinal direction, which shows the construction of a semiconductor laser device.
Figure 2:
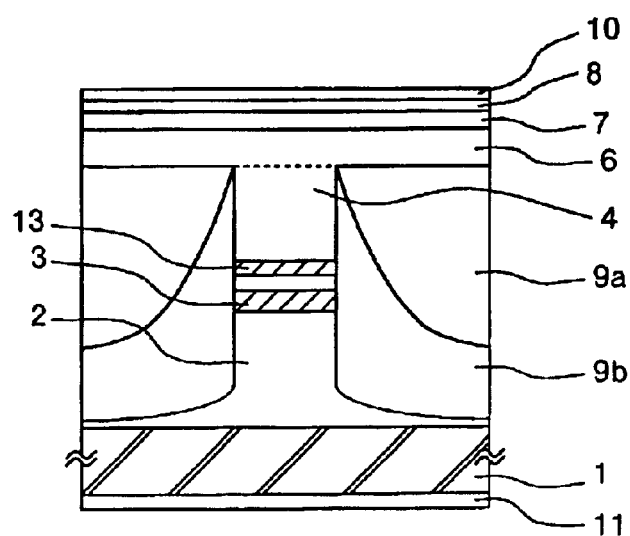
FIG. 2 is a sectional view of the semiconductor laser device shown in FIG. 1 taken along the line A—A.

At first, a first embodiment of the present invention will be explained. FIG. 1 is a longitudinal sectional view in the longitudinal direction of a semiconductor laser device, having a non-current injection area. FIG. 2 is a sectional view of the semiconductor laser device shown in FIG. 1, taken along the line A—A. In FIG. 1 and FIG. 2, this semiconductor laser device 20 has a structure in which an n-InP buffer layer 2 combining a buffer layer and a lower cladding layer by means of n-InP, a compressive strain GRIN-SCH- MQW (Graded Index-Separate Confinement Heterostructure Multi Quantum Well) active layer 3, a p-InP spacer layer 4, a p-InP cladding layer 6 and an InGaAsP contact layer 7 are sequentially laminated on a plane 100 of an n-InP substrate 1.

In the p-InP spacer layer 4, there is provided a diffraction grating 13 having a film thickness of 20 µm and a length Lg=50 µm from a radiation side reflection coating 15 towards a reflection coating 14 side. This diffraction grating 13 is formed cyclically at a pitch of about 220 nm, and selects the wavelength of the laser beam having a center wavelength of 1.48 µm. The upper part of the p-InP spacer layer 4 including this diffraction grating 13, the GRIN-SCH-MQW active layer 3 and the n-InP buffer layer 2 is formed into a mesa stripe form, On the opposite sides of the mesa stripe in the longitudinal direction, a p-InP blocking layer 9b and a n-InP blocking layer 9a formed as the current blocking layer are embedded.

An n-InP layer 8 is formed on the upper surface of the p-InGaAsP contact layer 7 and up to 60 µm from the radiation side reflection coating 15 towards the reflection coating 14. The junction between the n-InP layer 8 and the p-InP cladding layer 6 becomes n-p junction with respect to the direction of the diffraction grating 13, and A hence functions as a current blocking layer. Therefore, current injection to the diffraction grating 13 is suppressed, the monitor current with respect to the optical output becomes stable, thereby realizing high-output semiconductor laser device, and making optical amplification control simple and easy.

In this semiconductor laser device 20, the current inflow to the lower part of the n-InP layer 8 is suppressed by increasing a contact resistance between the n-InP layer 8 and the p-side electrode 10, and by making the relation between the n-InP layer 8 and the p-InGaAsP contact layer 7 to become reverse bias. Therefore, instead of the n-InP layer 8 in which the contact resistance increases with respect to the p-side electrode 10, as in the relation between the n-InP layer 8 and the p-side electrode 10, for example, an i-InP (genuine InP) layer, an n-InGaAsP layer, an i-InGaAsP layer, an n-InGaAs layer, or an i-InGaAs layer may be formed, to increase the contact resistance to thereby suppress the current injection to the vicinity of the diffraction grating 13. The n-InP layer 8 may be in a stripe shape having a width exceeding the width of the mesa-stripe structure, since this layer needs only to prevent the current from being injected to the mesa-stripe structure below the n-InP layer 8.

A p-side electrode 10 is formed on the upper face of the n-InP layer 8 and on the upper face of the p-InGaAsP contact layer 7 other than the area which is covered with the n-InP layer 8. A bonding pad (not shown) is preferably formed on the p-side electrode 10. The thickness of this bonding pad is preferably about 5 µm. For example, when the semiconductor laser device is assembled with a junction down method, this bonding pad serves as a buffer material which alleviates the shock at the time of assembly with this thickness, and by this thickness, wraparound of a solder is prevented at the time of joining to a heat sink, and hence a short-circuit due to the wraparound of the solder can be prevented. On the other hand, an n-side electrode 11 is formed on the backside of the n-InP substrate 1. Each semiconductor laser device having these p-side electrode 10 and n-side electrode 11 formed on the semiconductor wafer is separated from each other by a cleavage.

Thereafter, a reflection coating 14 having a reflectance of 80% or higher, preferably a high optical reflectance of 98% or higher is formed on the light reflection end face, being one end face of the semiconductor laser device 20 in the longitudinal direction, and an radiation side reflection coating 15 having a reflectance of 2% or less, preferably a low optical reflectance of 0.1% or less is formed on the light radiation end face, being the other end face. The light generated in the GRIN-SCH-MQW active layer 3 of the optical resonator formed by the reflection coating 14 and the radiation side reflection coating 15 is reflected by the reflection coating 14, and emitted as a laser beam through the radiation side reflection coating 15. At this time, the laser beam is subjected to wavelength selection by means of the diffraction grating 13 and is emitted.

It is a presupposition that the semiconductor laser device 20 is used as the excitation light source for the Raman amplifier, and the oscillation wavelength $\lambda_0$ thereof is from 1100 nm to 1550 nm, and the length L of the resonator is designated as from at least 800 µm to 3200 µm or less. In general, the mode interval $\Delta\lambda$ of the longitudinal mode generated by the resonator of the semiconductor laser device can be expressed by the following equation, assuming that the effective refractive index is "n". That is, $$\Delta\lambda = \lambda^2/(2 \cdot n \cdot L).$$

Here, if the oscillation wavelength $\lambda_0$ is designated as 1480 µm, and the effective refractive index is designated as 3.5, when the length L of the resonator is 800 µm, the mode interval $\Delta\lambda$ of the longitudinal mode becomes about 0.39 nm, and when the length L of the resonator is 3200 µm, the mode interval $\Delta\lambda$ of the longitudinal mode becomes about 0.1 nm. That is to say, as the length L of the resonator increases, the mode interval $\Delta\lambda$ of the longitudinal mode becomes narrower, and the selection condition of emitting the laser beam of a single longitudinal mode becomes stricter.

On the other hand, the diffraction grating 13 selects the longitudinal mode by the Bragg wavelength. The selective wavelength characteristic by means of this diffraction grating 13 is expressed as the oscillation wavelength spectrum 30 shown in FIG. 3.

Figure 3:
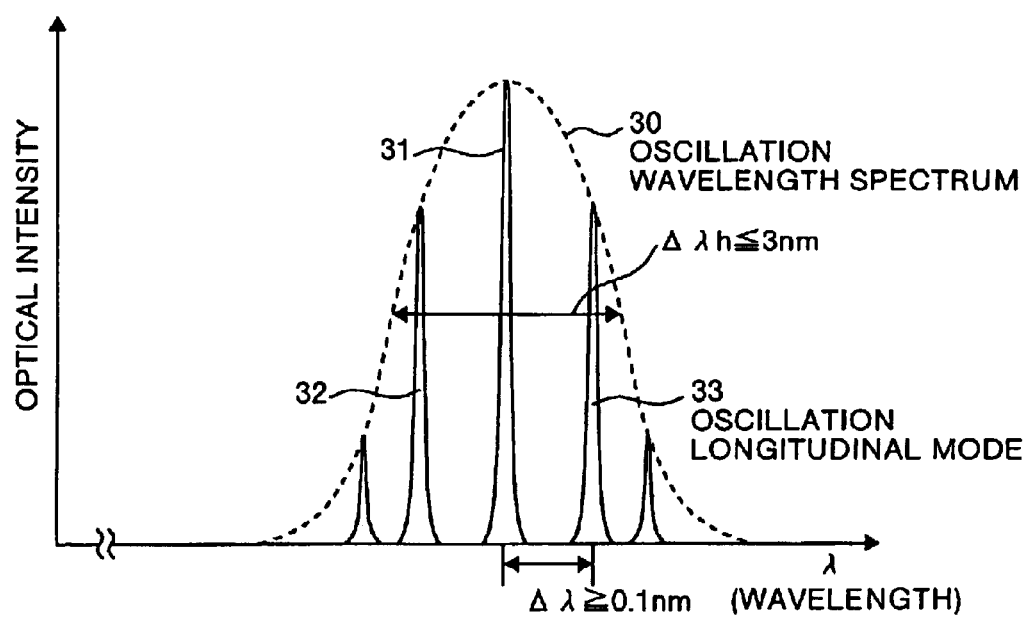
FIG. 3 is a diagram which shows the relation between the, oscillation wavelength spectrum and the oscillation longitudinal mode of the semiconductor laser device shown in FIG. 1, FIGS. 4A and 4B are diagrams which show the relation of a laser beam output power between a single oscillation longitudinal mode and a plurality of emission longitudinal modes, and shows a threshold of induced Brillouin scattering.

As shown in FIG. 3, in this semiconductor laser device 20, a plurality of oscillation longitudinal modes exist in the wavelength selection characteristic indicated by the half bandwidth $\Delta\lambda h$ of the oscillation wavelength spectrum 30 by means of the semiconductor laser device 20 having the diffraction grating 13. With the conventional DFB (Distributed Feedback) semiconductor laser device or DBR (Distributed Bragg Reflector) semiconductor laser device, if the length L of the resonator is designated as 800 µm or larger, single longitudinal mode oscillation has been difficult, and hence a semiconductor laser device having such a length L of the resonator has not been used. With the semiconductor laser device 20, however, by positively making the length L of the resonator 800 µm or larger, a plurality of oscillation longitudinal modes is made to exist in the half bandwidth $\Delta\lambda h$ of the oscillation wavelength spectrum, and is output from the laser device, In FIG. 3, there are three oscillation longitudinal modes 31 to 33 in the half bandwidth $\Delta\lambda h$ of the oscillation wavelength spectrum.

Figure 4A:
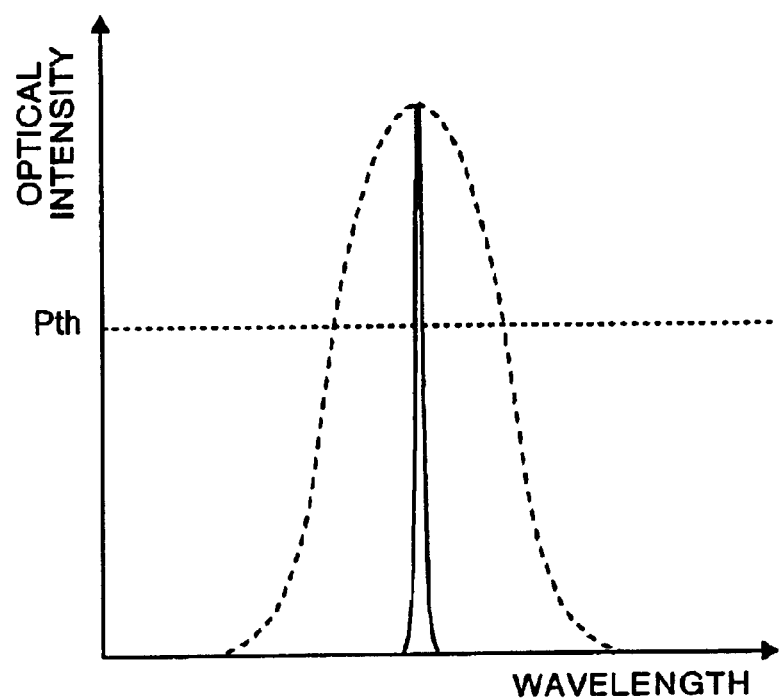

When a laser beam having a plurality of oscillation longitudinal modes is used, the peak value of the laser output is suppressed, and a high laser output value can be obtained, as compared with an instance in which a laser beam of a single longitudinal mode is used. For example, this semiconductor laser device has a profile shown in FIG. 4(b), and a high laser output can be obtained with a low peak value. On the contrary, FIG. 4(a) shows a profile of a semiconductor laser device having a single longitudinal mode oscillation when the same laser output is to be obtained, and has a high peak value.

Figure 4B:
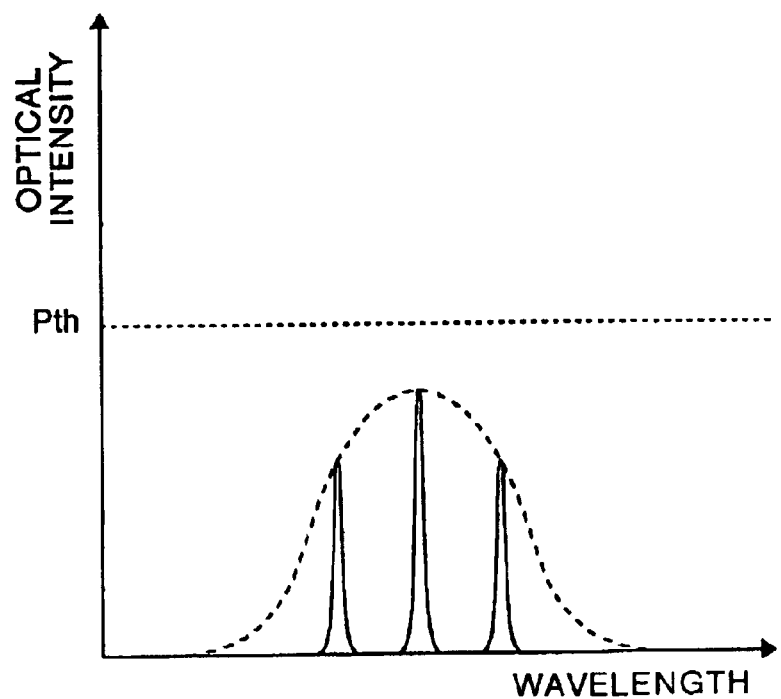

In the instance in which the semiconductor laser device is used as the excitation light source for the Raman amplifier, it is desired to increase the output power of the exciting light in order to increase the Raman gain. However, if the peak value is high, induced Brillouin scattering occurs to there by increase noise. The occurrence of the induced Brillouin scattering has a threshold Pth at which the induced Brillouin scattering occurs. When the same laser output power is to be obtained, as shown in FIG. 4(b), by having a plurality of oscillation longitudinal modes to suppress the peak value, a high output power of the exciting light can be obtained within the threshold Pth of the induced Brillouin scattering. As a result, a high Raman gain can be obtained.

The wavelength interval (mode interval) $\Delta\lambda$ between the oscillation longitudinal modes 31 to 33 is made to be 0.1 nm or larger. This is because when the semiconductor laser device 20 is used as the excitation light source for the Raman amplifier, if the mode interval $\Delta\lambda$ is not larger than 0.1 nm, there is high possibility that the induced Brillouin scattering may occur. As a result, it is preferable that the length L of the resonator described above be 3200 $\mu$m or less, from the equation of the mode interval $\Delta\lambda$.

From this point of view, the number of oscillation longitudinal modes included within the half bandwidth $\Delta\lambda h$ of the oscillation wavelength spectrum 30 is desirably plural. In the Raman amplification, there is a polarization dependency in the amplification gain, and hence it is necessary to reduce the influence of a deviation between the polarization direction of the signal light and the polarization direction of exciting light. As a method of achieving this, there is a method of depolarizing the exciting light. Specifically, there are a method of the output light from two semiconductor laser devices 20, and a method in which a polarization-maintaining fiber having a predetermined length is used as a depolarizer, and the laser beam emitted from one semiconductor laser device 20 is propagated to this polarization-maintaining fiber. When the latter method is used as the depolarization method, since the coherency of the laser beam decreases with an increase in the number of oscillation longitudinal modes, the length of the polarization-maintaining fiber required for depolarization can be made short. In particular, when there are four or five oscillation longitudinal modes, the required length of the polarization-maintaining fiber becomes extremely short. Therefore, when the laser beam emitted from the semiconductor laser device 20 is to be depolarized in order to use it for the Raman amplifier, the laser beam emitted from one semiconductor laser device 20 can be easily depolarized and used, without using the light emitted from two semiconductor laser devices by the polarization multiplex. As a result, the number of parts used for the Raman amplifier can be reduced, and miniaturization can be promoted.

Here, if the width of the oscillation wavelength spectrum is too wide, the coupling loss due to the wavelength multiplexing coupler increases, thereby causing noise or gain variation depending on the movement of the wavelength in the width of the oscillation wavelength spectrum. Hence, it is necessary that the half bandwidth $\Delta\lambda h$ of the oscillation wavelength spectrum 30 is not larger than 3 nm, and preferably, not larger than 2 nm.

Figure 23:
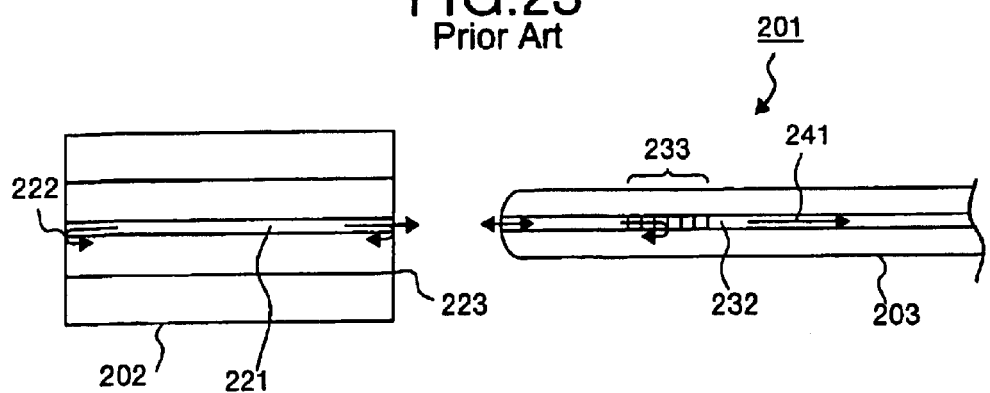
FIG. 23 is a diagram which shows the construction of a semiconductor laser module used for the Raman amplifier shown in FIG. 22, and FIGS. 24A and 24B are diagrams which show the optical output dependency of the monitor current in a conventional semiconductor laser device.
Figure 24A:
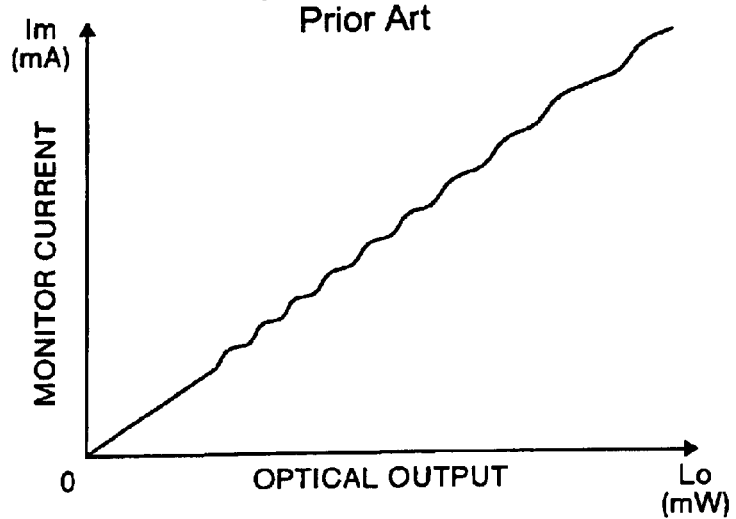
Figure 24B:
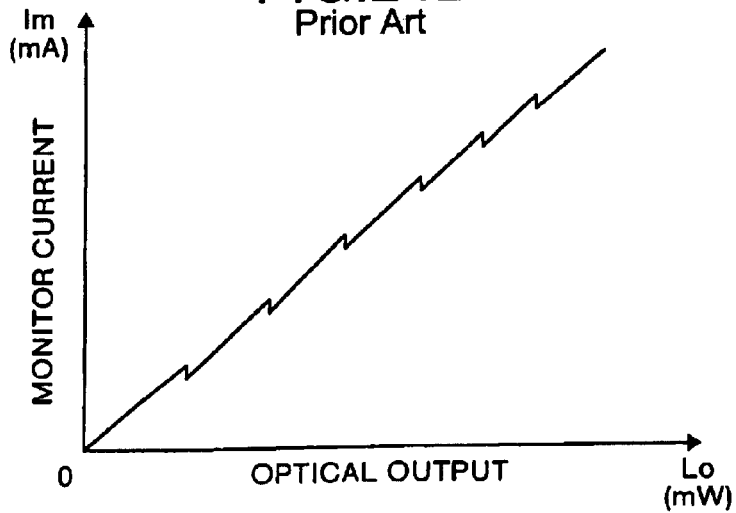

With the conventional semiconductor laser device, as shown in FIG. 23, a semiconductor laser module is formed using the fiber grating, and hence the relative intensity noise (RIN) increases due to the resonance between the fiber grating 233 and the light reflection surface 222, and as a result, stable Raman amplification cannot be performed. However, this semiconductor laser device 20 does not use the fiber grating 233, and the laser beam emitted from the radiation side reflection coating 15 is directly used as the excitation light source for the Raman amplifier. Hence, the relative intensity noise decreases, and as a result, fluctuations in the Raman gain decrease, thereby enabling stable Raman amplification.

Since the semiconductor laser module shown in FIG. 23 requires a mechanical coupling in the resonator, there may be an instance in which the oscillation characteristic of the laser changes due to vibrations or the like. However, with this semiconductor laser device, there is no change in the oscillation characteristic of the laser due to mechanical vibrations or the like, thereby stable optical output can be obtained.

The n-InP layer 8 is formed on the upper part of the diffraction grating 13, and between the p-InGaAsP contact layer 7 and the p-side electrode 10, from the radiation side reflection coating 15 towards the reflection coating 14, in a length of Li=60 $\mu$m. Therefore, the injection current applied from the p-side electrode 10 towards the n-side electrode 11 flows in the current injection area E2, which is below the area that is not covered with the n-InP layer 8, so that inflow of the injection current into the non-current injection area E1, which is below the area covered with the n-InP layer 8, is suppressed.

Figure 5:
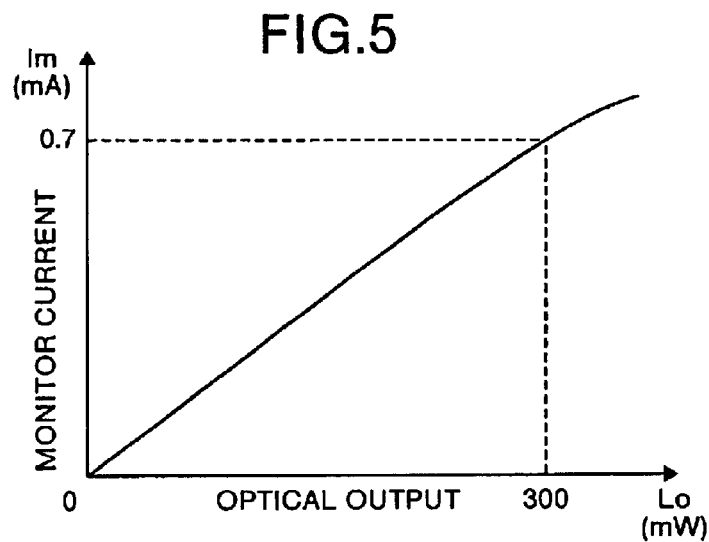
FIG. 5 is a diagram which shows the optical output dependency of a monitor current in the semiconductor laser device shown in FIG. 1, FIGS. 6A and 6B are diagrams which show a difference in the optical output dependency of the monitor current, due to the existence of a non-current injection area, in the instance of the diffraction grating length being 100 μm.

As shown in FIG. 5, by the suppression of the injected current into the vicinity of the diffraction grating 13 within the non-current injection area E1, fine fluctuations decrease in the optical output dependency of the monitor current leaked from the rear end of the semiconductor laser device 20, that is, from the reflection coating 14 side, thereby the optical amplification control becomes simple and easy, and stable optical output can be easily obtained. As a result, the semiconductor laser device 20 makes the amplification control easy, when used as the excitation light source for the Raman amplifier. In particular, in the instance of a semiconductor laser device having an output as large as 300 mW or higher, with an increase of the value of the injected current, fine fluctuations likely occur in the optical output characteristic of the monitor current. However, as shown in FIG. 5, even around the optical output of 300 mW, fine fluctuations do not occur in the monitor current, thereby making the optical amplification control simple and easy. In the instance of the conventional semiconductor laser device which does not have a non-current injection area formed therein, the semiconductor laser device having the optical output dependency of the monitor current shown in FIG. 5 can only be obtained by about 20%. However, by forming this non-current injection area, the semiconductor laser device having the optical output dependency of the monitor current shown in FIG. 5 can be obtained by about 70%.

Further, on the end face of the radiation side reflection coating 15 in the GRIN-SCH-MQW active layer 3, COD (catastrophic Optical Damage) likely occurs. The COD is a phenomenon that on the end face of the radiation side reflection coating 15 in the GRIN-SCH-MQW active layer 3, a feedback cycle occurs such that temperature increase of the end face→reduction of a band gap→light absorption→re-coupled current→temperature increase of the end face, and this cycle becomes a positive feedback, to thereby melt the end face, and hence the end face deteriorates instantaneously. In this semiconductor laser device 20, since the end face of the radiation side reflection coating 15 is within the non-current injection area E1, the injected current is suppressed, and it is expected that the event probability of COD can be reduced by the suppression of heat generation. With the InP-type semiconductor laser device, the COD hardly occurs as compared to the instance of the GaAs type. However, in the instance of a semiconductor laser device having high output of about 300 mW or higher, a temperature rise on the end face increases, even in the InP type, and hence the COD easily occurs.

The GRIN-SCH-MQW active layer 3 in the current injection area E2 emits light due to the injected current, while the GRIN-SCH-MQW active layer 3 in the non-current injection area E1 performs photon recycle by means of the light from the GRIN-SCH-MQW active layer 3 in the current injection area E2. Hence, even if there is no injected current, it serves as a buffer amplifier which transmits and outputs the laser beam to the radiation side reflection coating 15, and hence, the laser beam is not attenuated. Moreover, the non-current injection area E1 formed by the n-InP layer 8 is only 70 µm at most, and taking into consideration that the length L of the resonator is 3200 µm≧L≧800 µm, it is a small area. As a result, the laser output of the semiconductor laser device 20 in this first embodiment can be maintained substantially in the same level as that of the semiconductor laser device in which the non-current injection area E1 is not formed.

The length Li of the n-InP layer 8 is preferably a length exceeding the length Lg of the diffraction grating 13. However, if the length Li of the n-InP layer 8 is made too long, the portion of the GRIN-SCH-MQW active layer 3 in the current injection area E2 decreases, thereby effecting a decrease in the output of the laser beam. Therefore, it is desired that the length Li of the n-InP layer 8 be a length exceeding the length of the diffraction grating 13 by a degree that the scattering of the injected current from the endpoint on the reflection coating 14 side in the p-InGaAsP contact layer 7 towards the n-side electrode 11 does not affect the diffraction grating 13. Therefore, in this semiconductor laser device 20, the length Li of the n-InP layer 8 is made to be 60 µm, which is longer than the length Lg=50 µm of the diffraction grating 13 by 10 µm.

Figure 6A:
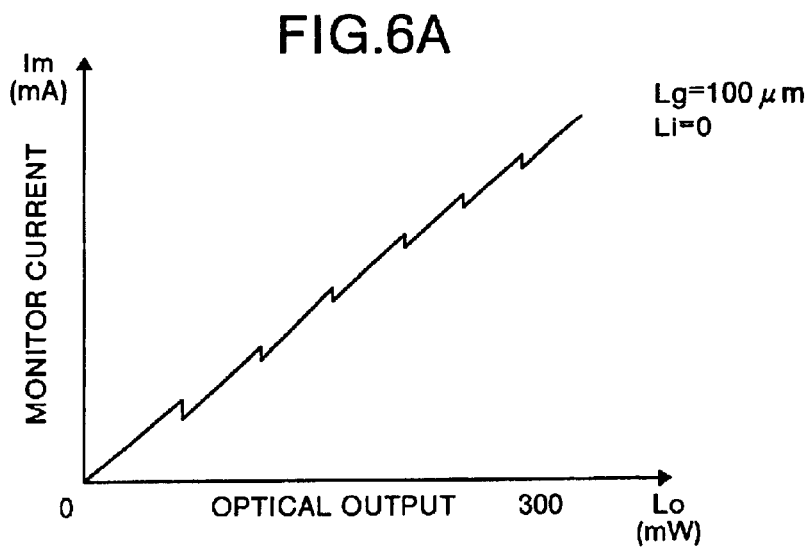
Figure 6B:
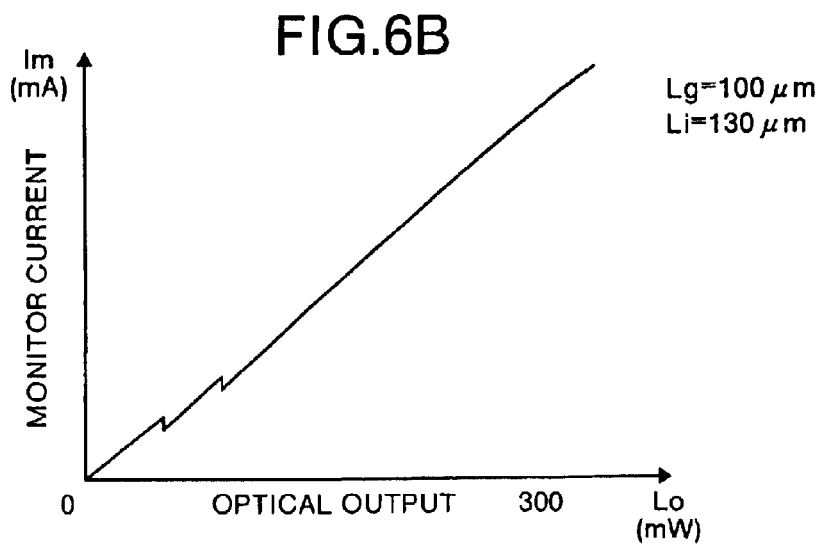

With the semiconductor laser device 20 shown in FIG. 1 and FIG. 2, the length Lg of the diffraction grating 13 is made to be 50 µm, and the length Li of the n-InP layer 8 is made to be 60 µm. However, it has been found that a certain effect can be obtained, even in the instance in which the length of the diffraction grating 13 is made as long as 100 µm, and the length Li of the n-InP layer 8 is made to be 130 µm. FIG. 6A shows the optical output dependency of the monitor current in the instance in which the length Lg of the diffraction grating 13 is made to be 100 µm, and the n-InP layer 8 is not provided. In this instance, the monitor current IM causes fluctuations that change stepwise with an increase of the optical output, over the whole area of the optical output Po. On the other hand, FIG. 6B shows the optical output dependency of the monitor current in the instance in which the length Lg of the diffraction grating 13 is made to be 100 µm, and the length Li of the n-InP layer 8 is made to be 130 µm. As shown in FIG. 6B, even if the length Lg of the diffraction grating 13 is as long as 100 µm, by providing the n-InP layer 8, fluctuations in the monitor current Im do not occur in the high output area of the optical output Po. Accordingly, in the low output area of the optical output Po, the semiconductor laser device cannot be put into a practical use, but in the instance when the optical output Po is used in the high output area, the semiconductor laser device is suitable for practical use. That is to say, it is seen that by providing the n-InP layer 8 to form the non-current injection area, the optical output dependency of the monitor current is improved.

Figure 7:
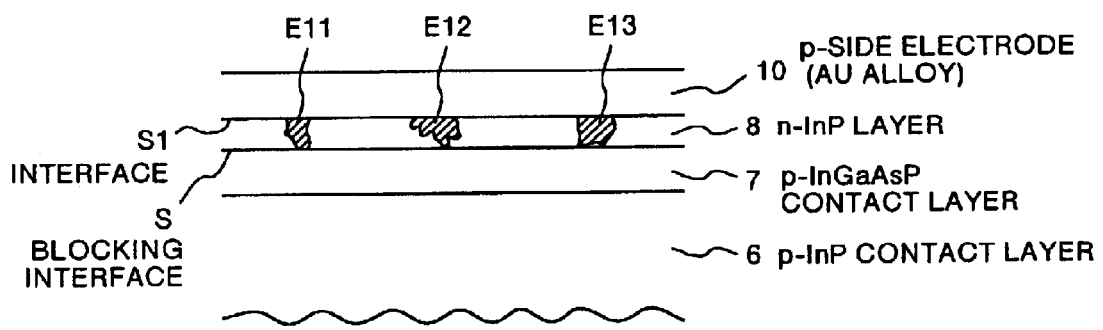
FIG. 7 is a sectional view of the non-current injection area of the semiconductor laser device shown in FIG. 1, in an enlarged scale.

In the non-current injection area of the semiconductor laser device 20 shown in FIG. 1, the n-InP layer 8 comes in contact with the p-side electrode 10. FIG. 7 is a sectional view which shows the vicinity of the interface EA in which the n-InP layer 8 comes in contact with the p-side electrode 10, in an enlarged scale. In FIG. 1, the interface SS between the p-side electrode 10 and the p-InGaAsP contact layer 7 becomes a contact between a metal and a semiconductor. In order to effect alloying in the vicinity of this interface SS, heat treatment is carried out.

However, the alloying by means of the heat treatment also occurs in the interface S1 between the n-InP layer 8 and the p-side electrode 10, and areas E11 to E13 in which alloying reaches a blocking interface S, being an interface between the n-InP layer 8 and the p-InGaAsP contact layer 7 may be generated, to thereby make the current flow into the diffraction grating 3. In such an instance, suppression of the current inflow by means of the n-InP layer 8, which serves as the current blocking layer, cannot be reliably performed.

Figure 8:
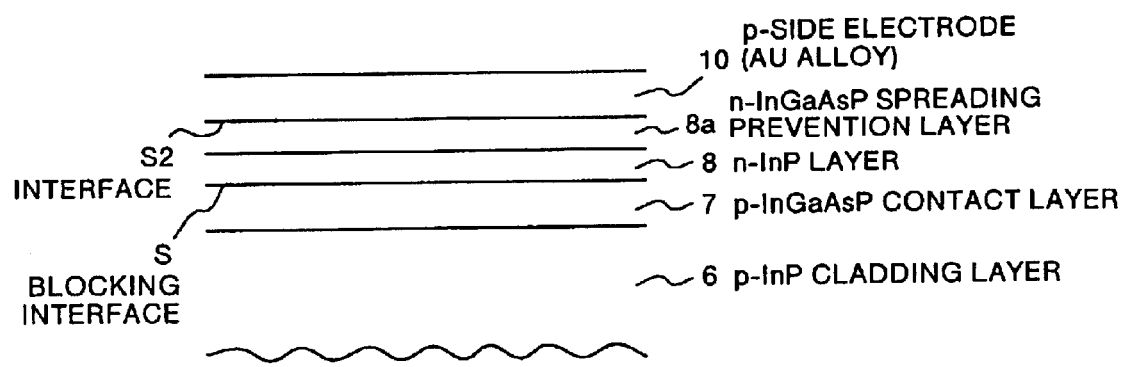
FIG. 8 is a sectional view of the non-current injection area of a semiconductor laser device in an enlarged scale, being a first embodiment of this invention.
Figure 9:
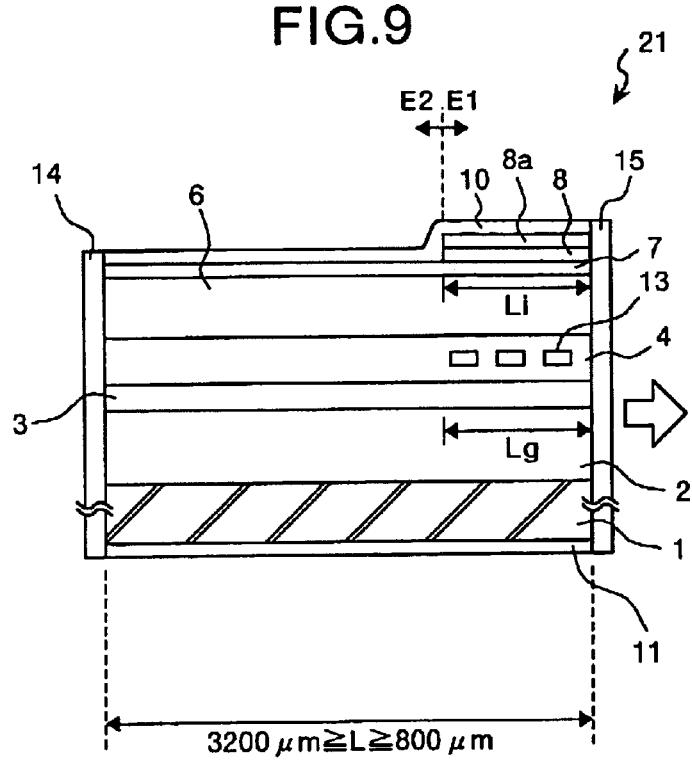
FIG. 9 is a longitudinal sectional view in the longitudinal direction, which shows the construction of the semiconductor laser device, being the first embodiment of this invention.

Therefore, in this first embodiment, as shown in FIG. 8, an n-InGaAsP diffusion prevention layer 8a is provided between the p-side electrode 10 and the n-InP layer 8, so that the above-described mixed crystallization does not reach the blocking interface S. In the n-InGaAsP diffusion prevention layer 8a, the bandgap wavelength is made to be from 1.10 to 1.35 µm, and preferably, 1.2 µm, in order to substantially match the lattice with the n-InP layer 8. The film thickness of the n-InGaAsP diffusion prevention layer 8a herein is made to be about 0.2 µm, but it needs to be at least 0.1 µm. By providing this n-InGaAsP diffusion prevention layer 8a, alloying is applied by the heat treatment in the vicinity of the interface S2 between the p-side electrode 10, which is an Au alloy, and the n-InGaAsP diffusion prevention layer-8a. However, this alloy portion does not proceed to the n-InP layer 8 and the p-InGaAsP contact layer 7 side. The overall construction in which this n-InGaAsP diffusion prevention layer 8a is provided is shown as a semiconductor laser device 21 shown in FIG. 9. Thereby, the non-current injection area which can reliably prevent current injection into the diffraction grating 13 can be formed.

The n-InGaAsP diffusion prevention layer 8a may be p-InGaAsP or i-InGaAsP, or may be n-InGaAs, p-InGaAs, or i-InGaAs, having a bandgap wavelength of 1.2 µm. The important thing is that the lattice match substantially occurs between the n-InGaAsP diffusion prevention layer 8a and the n-InP layer 8, alloying with the Au alloy in the p-side electrode 10 is effected only in the interface S2, and this alloying does not proceed to the diffraction grating 13 side.

In this first embodiment, the diffraction grating 13 is provided on the side of the radiation side reflection coating 15, but the diffraction grating may be provided also on the reflection coating 14 side. In the first embodiment, the n-InP substrate 1 is used, and the n-InP layer 8 is formed as the current blooking layer; However, in the instance of using a p-InP substrate as a semiconductor substrate, respective layers in the n-type and the p-type become opposite, and instead of the n-InP layer 8, a p-InP layer is arranged as the current blocking layer.

Figure 10:
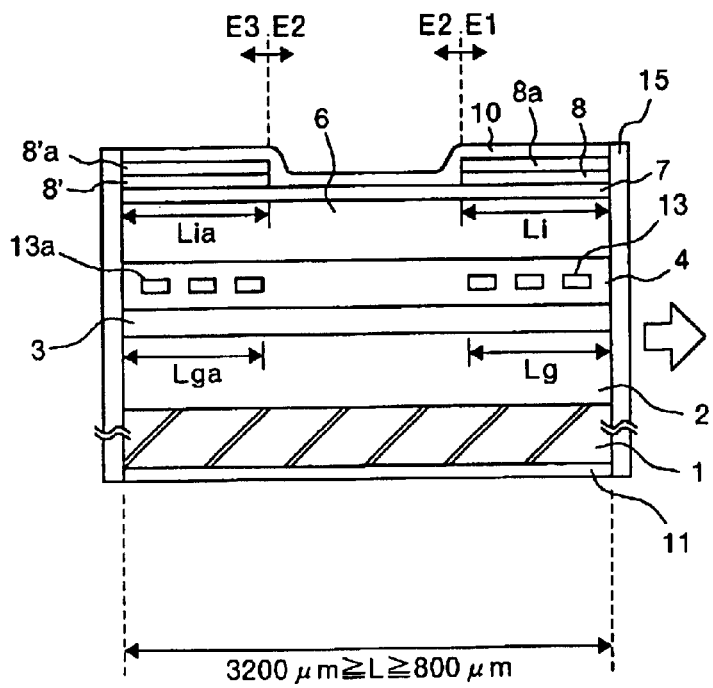
FIG. 10 is a longitudinal sectional view in the longitudinal direction, which shows the construction of a variation example of the semiconductor laser device, being the first embodiment of this invention.

FIG. 10 is a longitudinal sectional view in the longitudinal direction, of a variation example of the semiconductor laser device, being the first embodiment of this invention. In FIG. 10, this semiconductor laser device has a diffraction grating 13a having a length Lga from the reflection coating 14 side, also on the reflection coating 14 side. In order to prevent a decrease in the refractive index of this diffraction grating 13a, an n-InP layer 8' and an n-InGaAsP diffusion prevention layer 8'a on the upper layer thereof are provided. These n-InP layer 8' and n-InGaAsP diffusion prevention layer 8'*a* are provided on the upper part of the diffraction grating 13*a*, and between the p-InGaAsP contact layer 7 and the p-side electrode 10, as with the n-InP layer 8 and the n-InGaAsP diffusion prevention layer 8*a*, and have a length Lia. This length Lia has the same relation as that of between the length Lg and the length Li, and is set to be a minimum length that can cover the length Lga. In the diffraction grating 13*a* on the reflection coating 14 side, the product of the coupling coefficient κ and the length Lga is set to be a large value, for example, at least 2, in order to have the wavelength selectivity and the reflection characteristic.

Thereby, the non-current injection area E3 can be formed also on the diffraction grating 13*a*, to thereby suppress the inflow of the injected current to the vicinity of the diffraction grating 13*a*. As a result, as in the first embodiment, the monitor current with respect to the optical output becomes stable, and the optical amplification control becomes simple and easy even in a high-output semiconductor laser device. A deterioration on the end face on the reflection coating 14 side can be also prevented. Even in the semiconductor laser device provided with only the diffraction grating 13*a*, the monitor current with respect to the optical output becomes stable by employing this first embodiment, and hence the optical amplification control becomes simple and easy even in a high-output semiconductor laser device.

In this first embodiment, the n-InP layer 8 is provided above the diffraction grating 13 so as to suppress the inflow of the injected current to the vicinity of the diffraction grating 13, which is partially provided along the GRIN-SCH-MQW active layer 3, and the n-InGaAsP diffusion prevention layer 8*a* is provided between this n-InP layer 8 and the p-side electrode 10. As a result, the monitor current with respect to the optical output becomes stable, and the optical amplification control becomes simple and easy even in a high-output semiconductor laser device.

Also, since the semiconductor laser device in the first embodiment has such a construction that the diffraction grating 13, the n-InP layer 8 and the n-InGaAsP diffusion prevention layer 8*a* extend from the radiation side reflection coating 15, the injection current applied to the end face of the radiation side reflection coating 15 in the GRIN-SCH-MQW active layer 3 is suppressed, and hence it can be expected that the event probability of the COD can be further reduced.

Further, the semiconductor laser device 20 performs wavelength selection by the diffraction grating 13, and outputs a laser beam having a plurality of oscillation longitudinal modes, preferably at least four oscillation longitudinal modes in the half bandwidth Δλh of the oscillation wavelength spectrum 30, by setting the oscillation wavelength to a range of from 1100 nm to 1550 nm, and the length L of the resonator to a range of from 800 μm to 3200 μm. Hence, when this semiconductor laser device 20 is used as the excitation light source for the Raman amplifier, high Raman gain can be stably obtained, without causing the induced Brillouin scattering.

Optical coupling between an optical fiber having a fiber grating and a semiconductor light emission element is not performed within a resonator, as in the semiconductor laser module using a fiber grating. Hence, assembly becomes easy, and unstable output due to mechanical vibrations can be avoided.

In the first embodiment, the semiconductor laser device 20 has such a construction that the diffraction grating 13 is formed along the GRIN-SCH-MQW active layer 3. However, the present invention is not limited to this construction, and it is obvious that a semiconductor laser device in which an optical guided wave path adjacent to an active layer is provided, and a diffraction grating is formed along this optical guided wave path can be similarly applied.

In the above first embodiment, a plurality of oscillation longitudinal modes are output by the wavelength selectivity in which the diffraction grating 13 or the diffraction grating 13*a* has fluctuations with respect to the center wavelength. However, there may be obtained a semiconductor laser device in which fluctuations are positively generated with respect to the diffraction grating 13 or the diffraction grating 13*a* to thereby increase the number of oscillation longitudinal modes.

Figure 11:
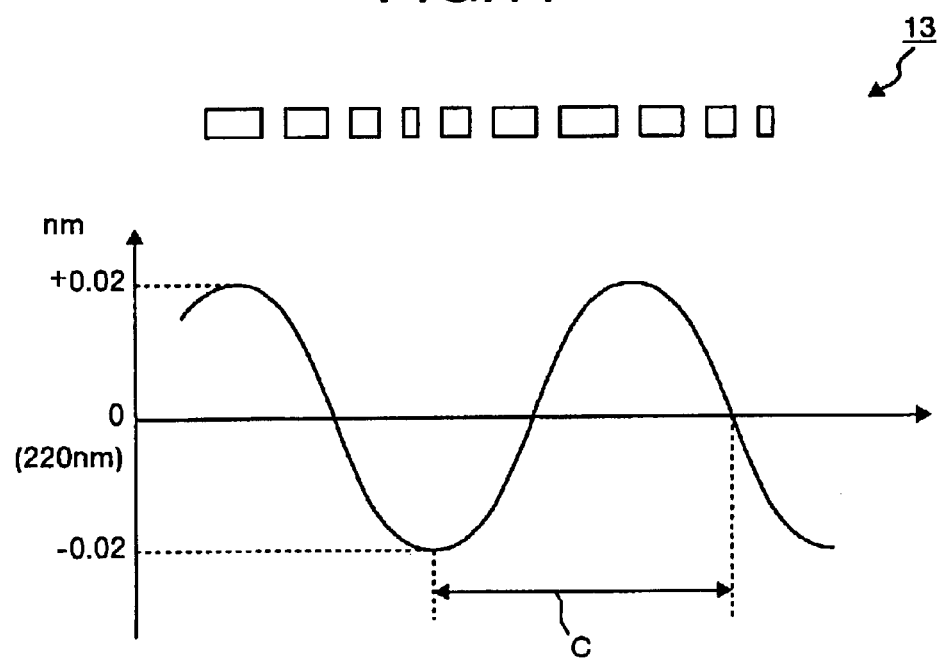
FIG. 11 is a diagram which shows the construction of a chirped grating applied to the diffraction grating.

FIG. 11 is a diagram which shows a cyclic change in a grating cycle of the diffraction grating 13. This diffraction grating 13 is a chirped grating in which the grating cycle is cyclically changed. In FIG. 11, fluctuations are generated in the wavelength selectivity of this diffraction grating 13, to thereby expand the half bandwidth Δλh of the oscillation wavelength spectrum, and increase the number of oscillation longitudinal modes in the half bandwidth Δλh.

As shown in FIG. 11, the diffraction grating 13 has an average cycle of 220 nm, and has, a structure in which cyclic fluctuations (deviation) of ±0.02 nm are repeated with a cycle C. By this cyclic fluctuations of ±0.02 nm, about three to six oscillation longitudinal modes can be included in the half bandwidth Δλh of the oscillation wavelength spectrum.

Figure 12:
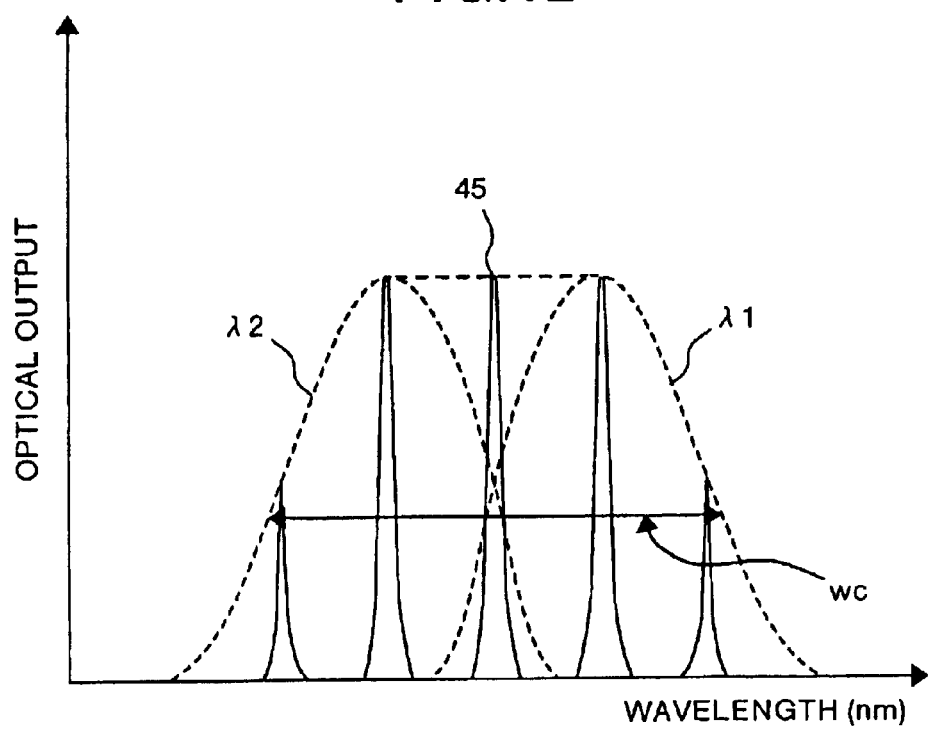
FIG. 12 is a diagram which shows the oscillation wavelength spectrum in the instance in which the chirped grating is applied to the diffraction grating.

For example, FIG. 12 is a diagram which shows an oscillation wavelength spectrum of a semiconductor laser device having diffraction gratings of different cycles $\Lambda_1$, $\Lambda_2$. In FIG. 28, the diffraction grating of the cycle $\Lambda_1$ forms an oscillation wavelength spectrum of a wavelength λ1, and three oscillation longitudinal modes are selected in this oscillation wavelength spectrum. On the other hand, the diffraction grating of the cycle $\Lambda_2$ forms an oscillation wavelength spectrum of a wavelength λ2, and three oscillation longitudinal modes are selected in this oscillation wavelength spectrum. Therefore, four to five oscillation longitudinal modes are included in the composite oscillation wavelength spectrum 45 by the diffraction gratings having cycles $\Lambda_1$, $\Lambda_2$. As a result, more oscillation longitudinal modes can be easily selected and output, thereby increasing the optical output, as compared with the instance when a single oscillation wavelength spectrum is formed.

As the construction of the diffraction grating 13, it is not limited to the chirped grating in which the grating cycle is changed in a certain cycle C, and the grating cycle may be changed at random between the cycle $\Lambda_1$ (220 nm+0.02 nm) and the cycle $\Lambda_2$ (220 nm−0.02 nm).

Figure 13A:
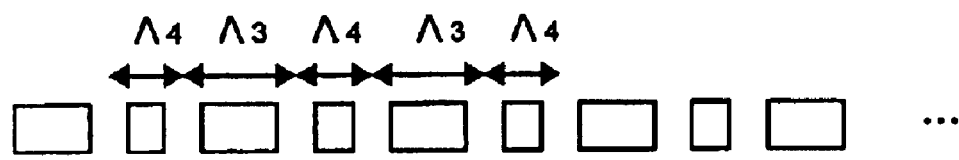
FIGS. 13A, 13B and 13C are diagrams which show a variation example of a grating having cyclic fluctuations.
Figure 13B:
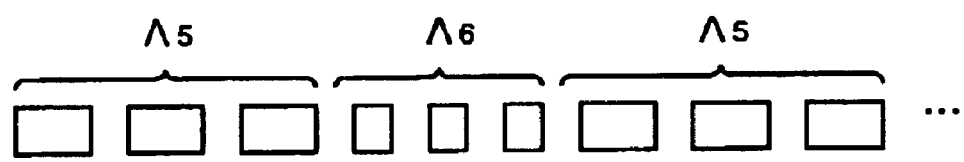
Figure 13C:
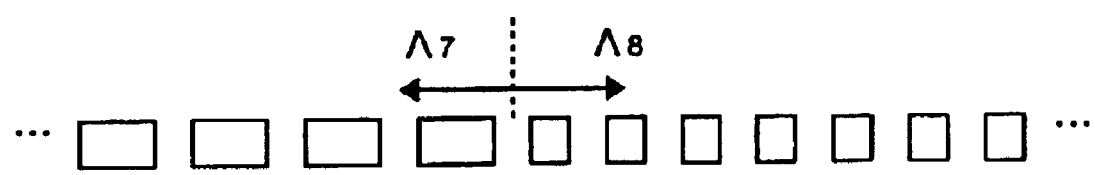

Further, as shown in FIG. 13A, cyclic fluctuations may be generated, as a diffraction grating in which the cycle $\Lambda_1$ and the cycle $\Lambda_2$ are alternately repeated. Alternatively, as shown in FIG. 13B, cyclic fluctuations maybe generated, as a diffraction grating having a plurality of continuous cycle $\Lambda_1$ and a plurality of cycle $\Lambda_2$, alternately. Alternatively, as shown in FIG. 13B, cyclic fluctuations may be generated, as a diffraction grating having a plurality of continuous cycle $\Lambda_1$ and a plurality of continuous cycle $\Lambda_2$. Alternatively, a cycle having a discrete different value between the cycle $\Lambda_1$ and the cycle $\Lambda_2$ may be interpolated and arranged.

(Second Embodiment)

A second embodiment of this invention will now be explained. In this second embodiment, the semiconductor laser device shown in the first embodiment is modulated.

Figure 14:
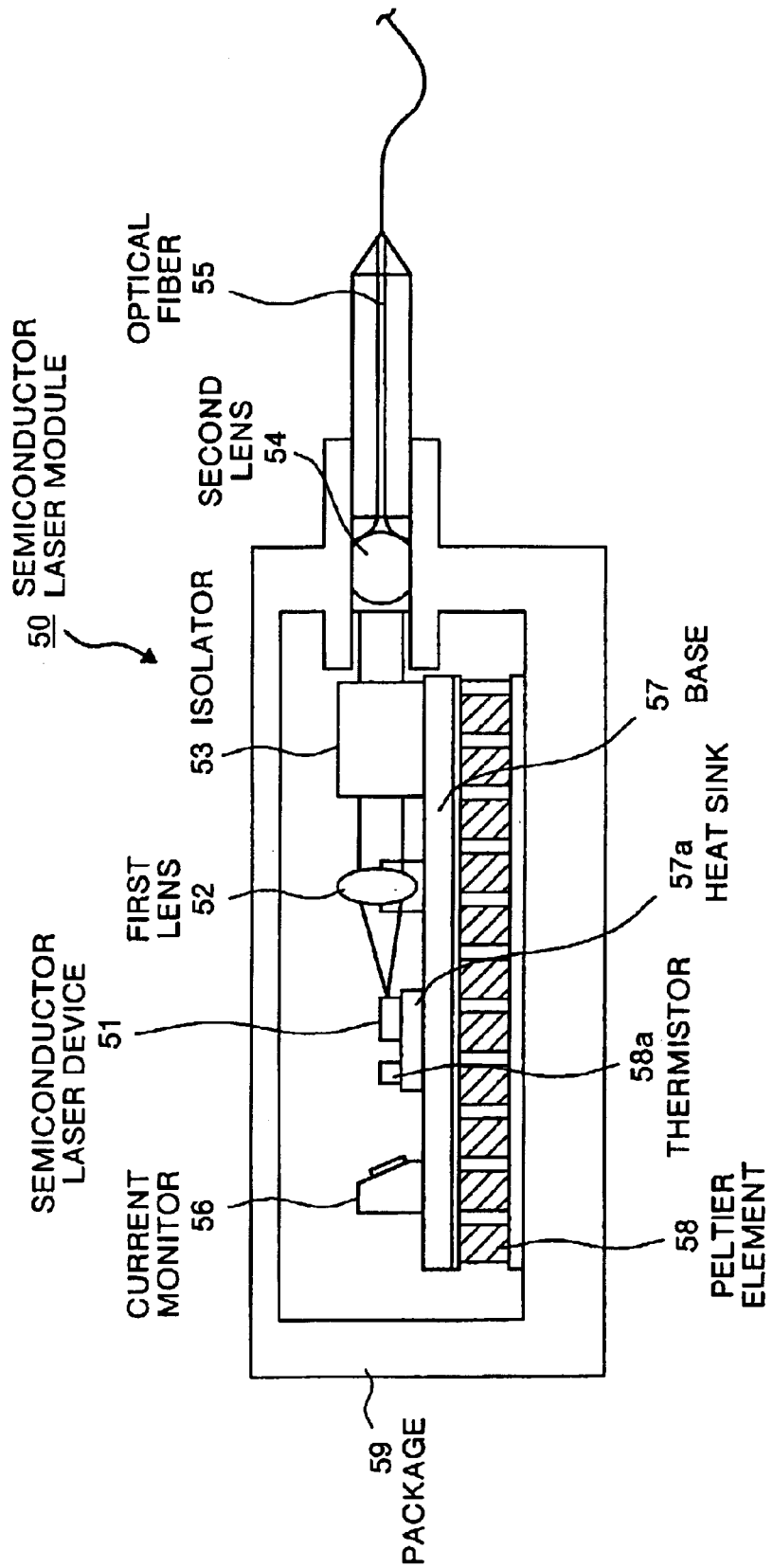
FIG. 14 is a longitudinal sectional view in the longitudinal direction, which shows the construction of a semiconductor laser module, being a second embodiment of this invention.

FIG. 14 is a longitudinal sectional view which shows the construction of a semiconductor laser module, being a second embodiment of this invention. In FIG. 14, this semiconductor laser module 50 has a semiconductor laser device 51 corresponding to the semiconductor laser device shown in the first embodiment. This semiconductor laser device 51 has a junction down construction in which the p-side electrode is joined to a heat sink 57a. As a housing of the semiconductor laser module 50, a Peltier element 58 as a temperature control unit is arranged on the inner bottom face of a package 59 formed of ceramics or the like. On the Peltier element 58, there is arranged a base 57, and the heat sink 57a is arranged on this base 57. Electric current (not shown) is supplied to the Peltier element 58, and cooling and heating are effected due to the polarity of the current, but it serves mainly as a cooler in order to prevent a deviation of the oscillation wavelength due to a temperature increase of the semiconductor laser device 51. That is to say, when the laser beam has a longer wavelength than a desired wavelength, the Peltier element 58 controls the semiconductor laser device to a low temperature by cooling, and when the laser beam has a shorter wavelength than the desired wavelength, it controls the semiconductor laser device to a high temperature by heating. This temperature control is performed specifically on the heat sink 57a, based on a detection value of a thermistor 58a arranged in the vicinity of the semiconductor laser device 51. A control unit (not shown) controls the Peltier element 58 so as to maintain the temperature of the heat sink 57a constant. The control unit (not shown) also controls the Peltier element 58 so that the temperature of the heat sink 57a decreases with an increase of the driving current of the semiconductor laser device 51. By performing such temperature control, the output stability of the semiconductor laser device 51 can be improved, thereby improving the yield. The heat sink 57a is desirably formed of a material having a high thermal conductivity such as diamond. This is because if the heat sink 57a is formed of diamond, heat generation at the time of application of high electric current can be suppressed.

On the base 57, there are arranged the heat sink 57a having the semiconductor laser device 51 and the thermistor 58a arranged thereon, a first lens 52 and a current monitor 56. The laser beam emitted from the semiconductor laser device 51 is wave-guided onto an optical fiber 55, through the first lens 52, an isolator 53 and a second lens 54. The second lens 54 is provided on the optical axis of the laser beam and on the package 59, and optically coupled to the optical fiber 55 that is externally connected. The current monitor 56 monitors and detects light leaked from the reflection coating side of the semiconductor laser device 51.

In this semiconductor laser module 50, the isolator 53 is intervened between the semiconductor laser device 51 and the optical fiber 55, so that the reflected return light due to other optical parts does not return to the resonator. For this isolator 53, not an inline type fiber model, but a polarization dependent isolator that can be built in the semiconductor laser module 50 can be used, different from the conventional semiconductor laser module using the fiber grating. Hence, insertion loss by means of the isolator can be made small, a low relative intensity noise (RIN) can be achieved, and the number of parts can be also reduced.

In this second embodiment, since the semiconductor laser device shown in the first embodiment is modulated, the polarization dependent isolator can be used to thereby reduce the insertion loss, reduce the noise and promote reduction of the number of parts.

(Third Embodiment)

A third embodiment of this invention will now be described. In this third embodiment, the semiconductor laser module shown in the above second embodiment is applied to a Raman amplifier.

Figure 15:
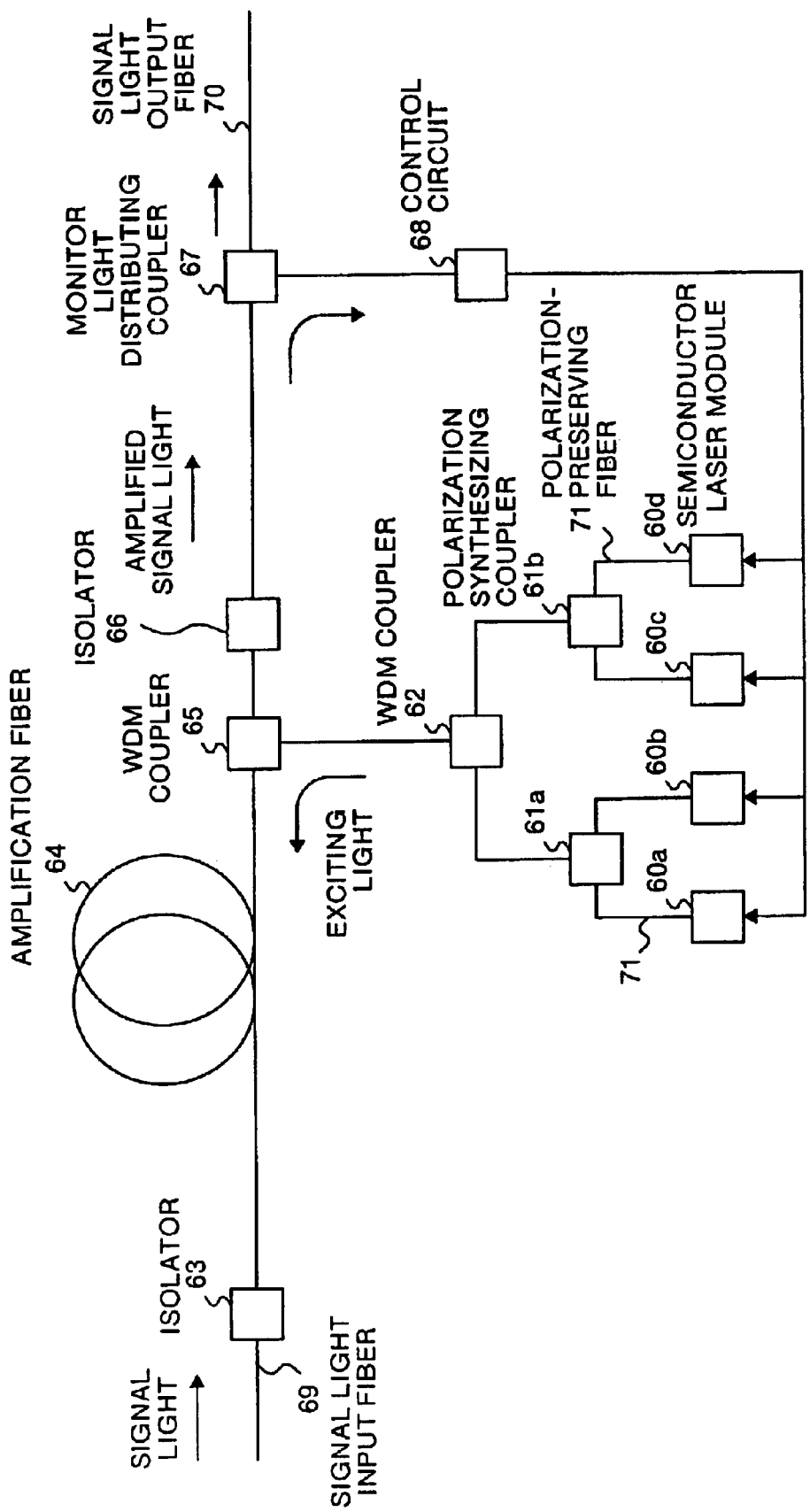
FIG. 15 is a block diagram which shows the construction of a Raman amplifier, being a third embodiment of this invention.
Figure 22:
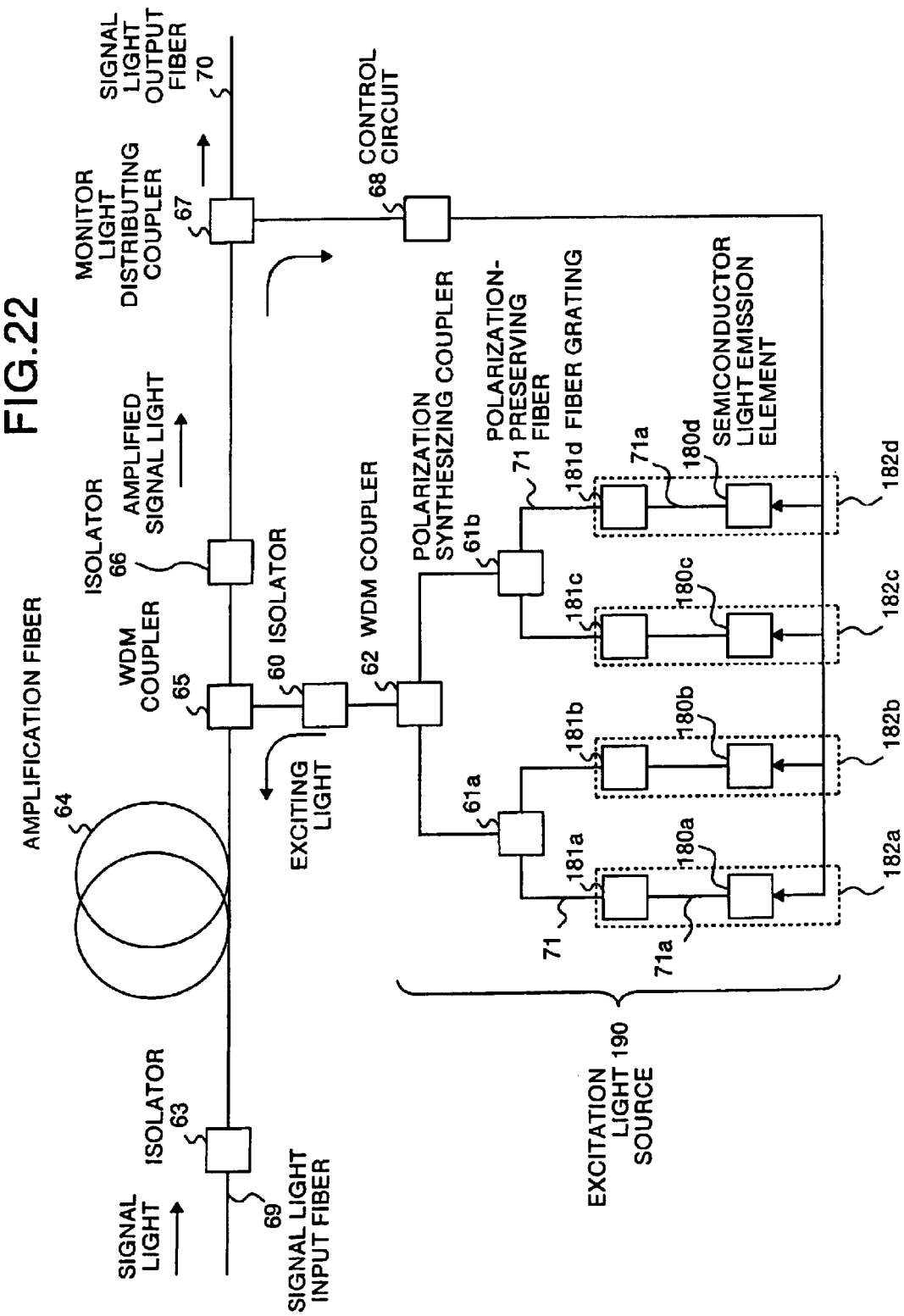
FIG. 22 is a block diagram which shows the schematic construction of a conventional Raman amplifier.

FIG. 15 is a block diagram which shows the construction of the Raman amplifier, being the third embodiment of this invention. This Raman amplifier is used for the WDM communication system. In FIG. 15, this Raman amplifier has such a construction that semiconductor laser modules 60a to 60d having the same construction as the semiconductor laser module shown in the above second embodiment are used, and the semiconductor laser modules 182a to 182d shown in FIG. 22 are replaced with the semiconductor laser modules 60a to 60d.

Each of the semiconductor laser modules 60a and 60b outputs a laser beam having a plurality of oscillation longitudinal modes to a polarization multiplexing couplers 61a through a polarization-maintaining fiber 71. Each of the semiconductor laser modules 60c and 60d outputs a laser beam having a plurality of oscillation longitudinal modes to a polarization multiplexing couplers 61b through the polarization-maintaining fiber 71. The laser beam emitted by the semiconductor laser modules 60a and 60b have the same wavelength. The laser beam emitted by the semiconductor laser modules 60c and 60d have the same wavelength but it is different from the wavelengths of the laser beams emitted by the semiconductor laser modules 60a and 60b. This is because the Raman amplifier has a polarization dependency, so that the laser beam is output by the polarization multiplexing couplers 61a and 61b, with the polarization dependency being eliminated.

The laser beams having a different wavelengths output from each polarization multiplexing coupler 61a, 61b are multiplexed by a WDM coupler 62, and the multiplexed laser beam is output to an amplification fiber 64 as exciting light for Raman amplification through a WDM coupler 65. A signal light to be amplified is input to the amplification fiber 64 to which the exciting light has been input, and is Raman-amplified.

The signal light (amplified signal light) which has been Raman-amplified in the amplification fiber 64 is input to a monitor light distributing coupler 67 through the WDM coupler 65 and an isolator 66. The monitor light distributing coupler 67 outputs a portion of the amplified signal light to the control circuit 68, and outputs the remaining amplified signal light to a signal light output fiber 70 as an output laser beam.

The control circuit 68 controls the laser output state, for example, the optical intensity of the semiconductor laser modules 60a to 60d, based on the input part of the amplified signal light and performs feedback control so that the gain band of the Raman amplification has a flat characteristic.

In the Raman amplifier shown in this third embodiment, for example, a semiconductor laser module 182a, in which a semiconductor light emission element 180a and a fiber grating 181a shown in FIG. 22 are coupled to each other by a polarization-maintaining fiber 71a, is not used, but the semiconductor laser module 60a having the semiconductor laser device shown in the first embodiment built therein is used. Hence, it is possible to reduce the use of the polarization-maintaining fiber 71, as well as realizing reduction in size and weight of the Raman amplifier, and cost reduction.

Figure 16:
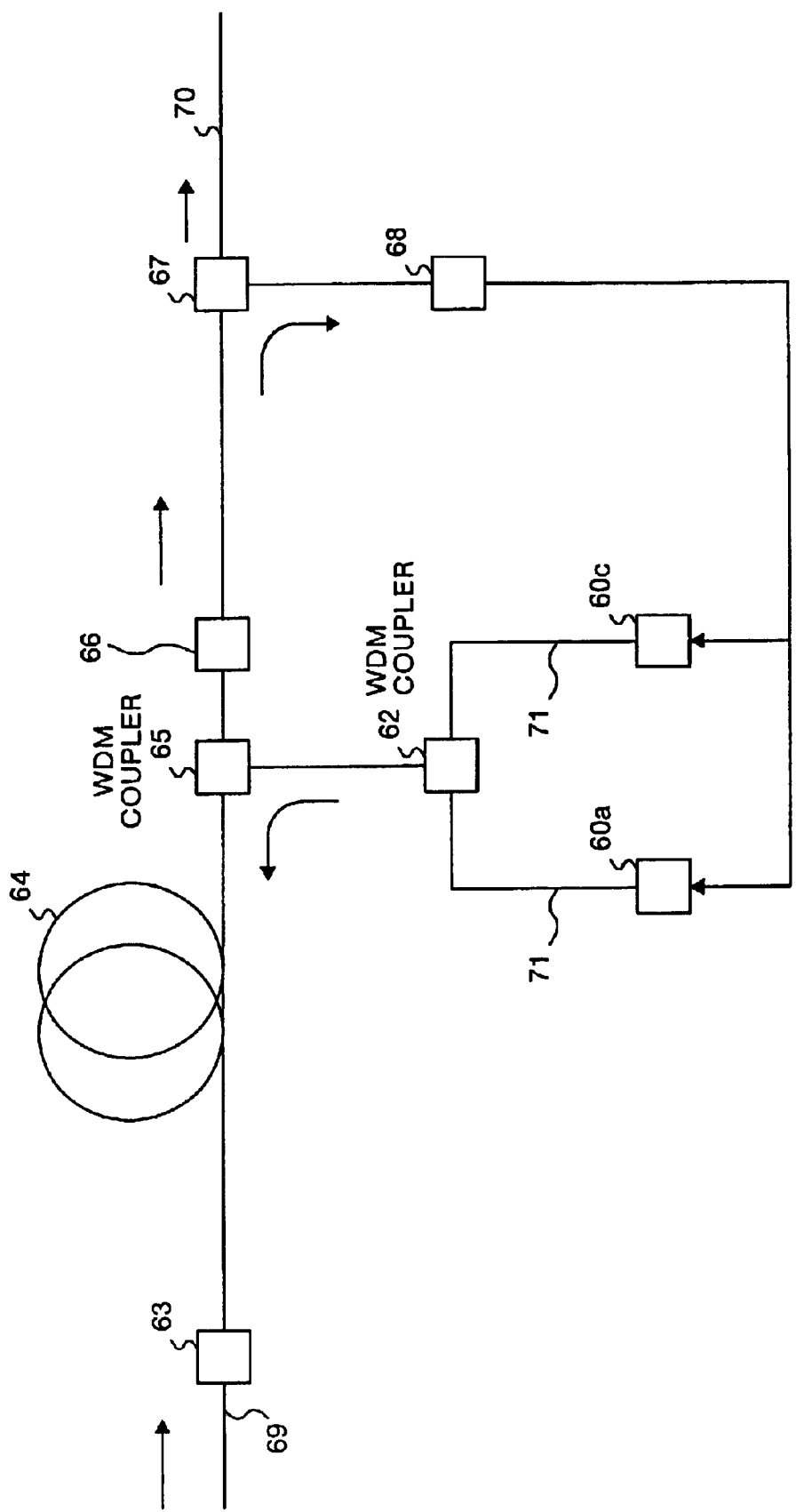
FIG. 16 is a block diagram which shows an application example of the Raman amplifier shown in FIG. 15.

In the Raman amplifier shown in FIG. 15, the polarization multiplexing couplers 61a, 61b are used. However, as shown in FIG. 16, light may be output from the semiconductor laser modules 60a and 60c directly to the WDM coupler 62 through the polarization-maintaining fiber 71, respectively. In this instance, the plane of polarization of each semiconductor laser module 60a, 60c is set to 45 degrees with respect to the polarization-maintaining fiber 71. As described above, since each of the semiconductor laser modules 60*a* and 60*c* includes a plurality of oscillation longitudinal modes, it possible to shorten the length of the polarization-maintaining fiber 71. As a result, the polarization dependency of the optical output from the polarization-maintaining fiber 71 can be eliminated, and hence a small Raman amplifier which is smaller in size and has a smaller number of parts can be realized.

If a semiconductor laser device having a large number of oscillation longitudinal modes is used as the semiconductor laser device built in the semiconductor laser modules 60*a* to 60*d*, the necessary length of the polarization-maintaining fiber 71 can be made short. In particular, when the number of oscillation longitudinal modes is four or five, the necessary length of the polarization-maintaining fiber 71 is made extremely short, and hence the Raman amplifier can be further simplified and reduced in size. Further, as the number of oscillation longitudinal modes increases, the coherent length becomes short, and the degree of polarization (DOP) is reduced due to depolarization, thereby enabling elimination of the polarization dependency. As a result, the Raman amplifier can be further simplified and reduced in size.

With this Raman amplifier, alignment of the optical axis is easy as compared with a semiconductor laser module using the fiber grating, and there is no mechanical optical coupling in the resonator. As a result, the stability and reliability of the Raman amplifier can be enhanced, also from this point of view.

Since the semiconductor laser device in the first embodiment includes a plurality of oscillation longitudinal modes, it is possible to generate high-output exciting light without causing the induced Brillouin scattering. Hence, high Raman gain can be stably obtained.

The Raman amplifiers shown in FIG. 15 and FIG. 16 are of a backward pumping system. However, as described above, since the semiconductor laser modules 60*a* to 60*d* output a stable exciting light, stable Raman amplification can be performed even in the forward pumping system or in the bi-directional excitation system.

Figure 17:
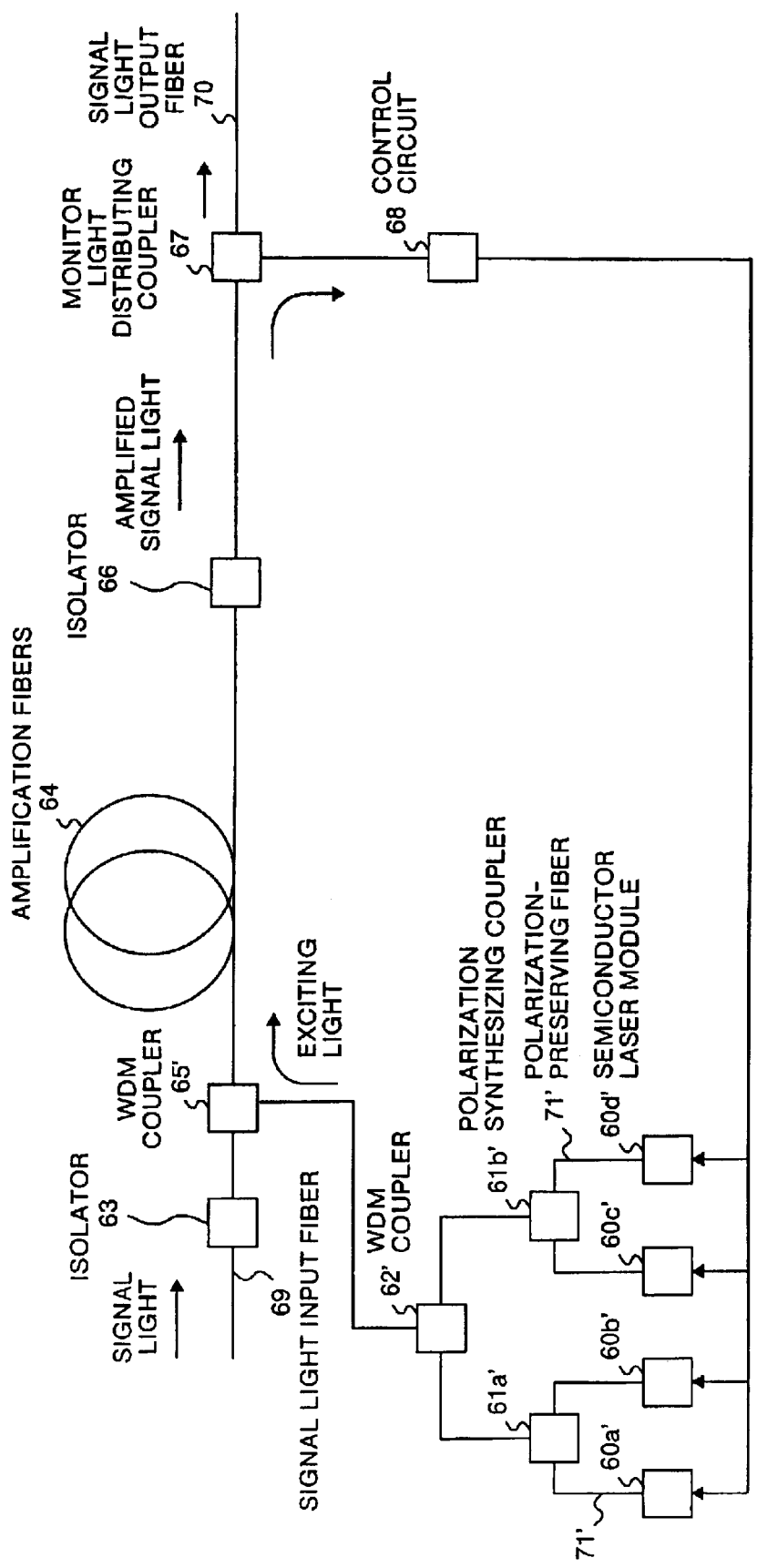
FIG. 17 is a block diagram which shows a variation example of the Raman amplifier shown in FIG. 15, which shows the construction of the Raman amplifier employing a forward pumping system.

For example, FIG. 17 is a block diagram which shows the construction of the Raman amplifier employing the forward pumping system. In the Raman amplifier shown in FIG. 17, a WDM communication system 65' is provided near an isolator 63 in the Raman amplifier shown in FIG. 15. A circuit having semiconductor laser modules 60*a*' to 60*d*', polarization multiplexing couplers 61*a*' and 61*b*', and a WDM coupler 62' respectively corresponding to the semiconductor laser modules 60*a* to 60*d*, the polarization multiplexing couplers 61*a* and 61*b*, and the WDM coupler 62 is connected to the WDM coupler 65', and the forward pumping is carried out in which the exciting light output from the WDM coupler 62' is output in the same direction as the signal light. In this instance, the semiconductor laser modules 60*l*' to 60*d*' use the semiconductor laser device used in the first embodiment, and hence the RIN can be reduced, and the forward pumping can be effectively carried out.

Figure 18:
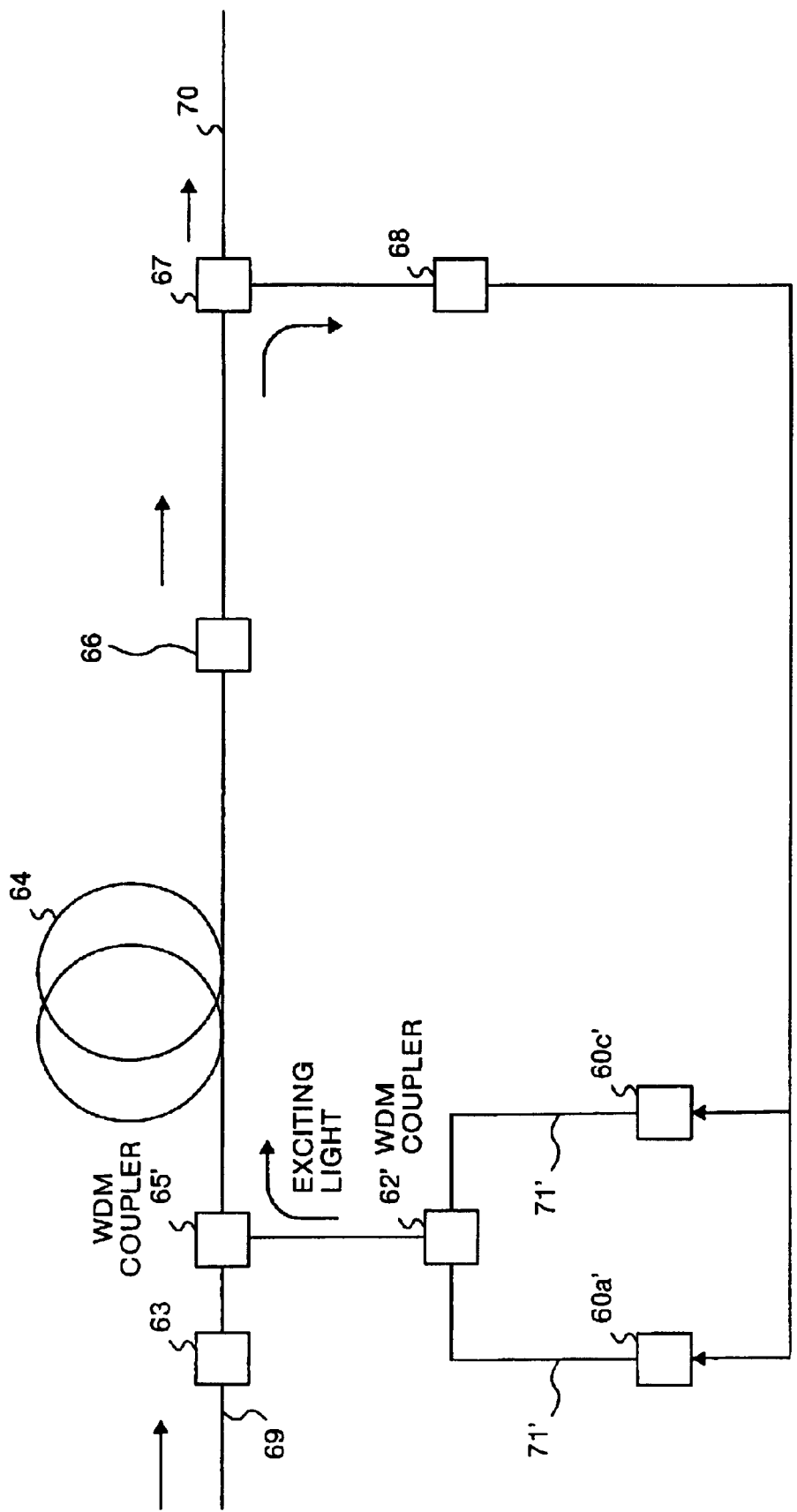
FIG. 18 is a block diagram which shows an application example of the Raman amplifier shown in FIG. 17.

Similarly, FIG. 18 is a block diagram which shows the construction of a Raman amplifier employing the forward pumping system. In the Raman amplifier shown in FIG. 18, the WDM coupler 65' is provided in the vicinity of the isolator 63 in the Raman amplifier shown in FIG. 16. A circuit having semiconductor laser modules 60*a*' and 60*c*' and a WDM coupler 62' respectively corresponding to the semiconductor laser modules 60*a* and 60*c* and the WDM coupler 62 is connected to the WDM coupler 65', and the forward pumping is carried out in which the exciting light output from the WDM coupler 62' is output in the same direction as the signal light. In this instance, the semiconductor laser modules 60*a*' and 60*c*' use the semiconductor laser device used in the first embodiment, and hence the RIN can be reduced, and the forward pumping can be effectively carried out.

Figure 19:
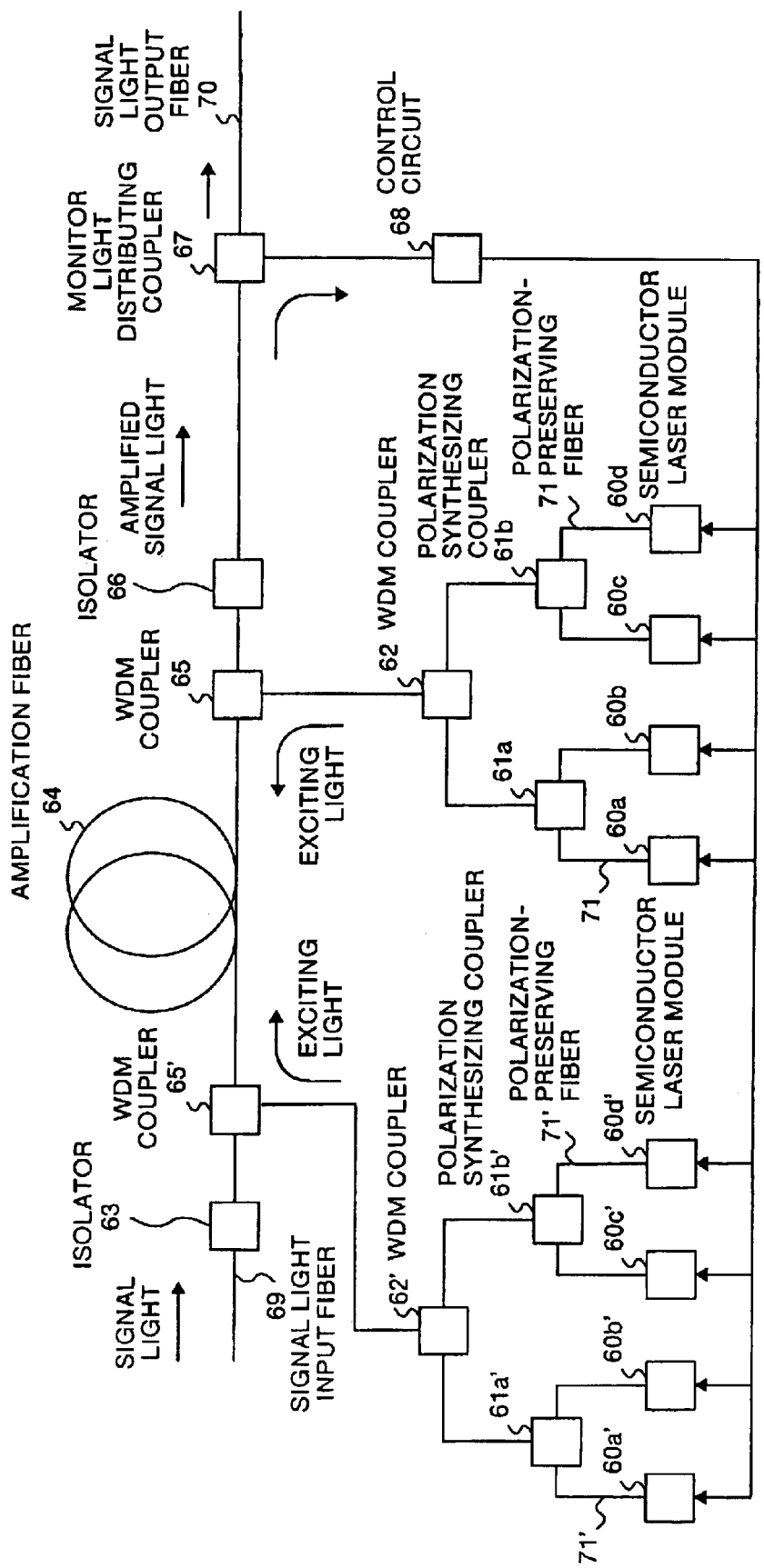
FIG. 19 is a block diagram which shows a variation example of the Raman amplifier shown in FIG. 15, which shows the construction of the Raman amplifier employing a bi-directional excitation system.

FIG. 19 is a block diagram which shows the construction of a Raman amplifier employing the bi-directional excitation system. In the Raman amplifier shown in FIG. 19, the WDM coupler 65', the semiconductor laser modules 60*a*' to 60*d*', the polarization multiplexing couplers 61*a*' and 61*b*' and the WDM coupler 62' shown in FIG. 17 are further provided, in the Raman amplifier shown in FIG. 15, thereby carrying out the backward pumping and forward pumping. In this instance, the semiconductor laser modules 60*a*' to 60*d*' use the semiconductor laser device used in the first embodiment, and hence the RIN can be reduced, and the forward pumping can be effectively carried out.

Figure 20:
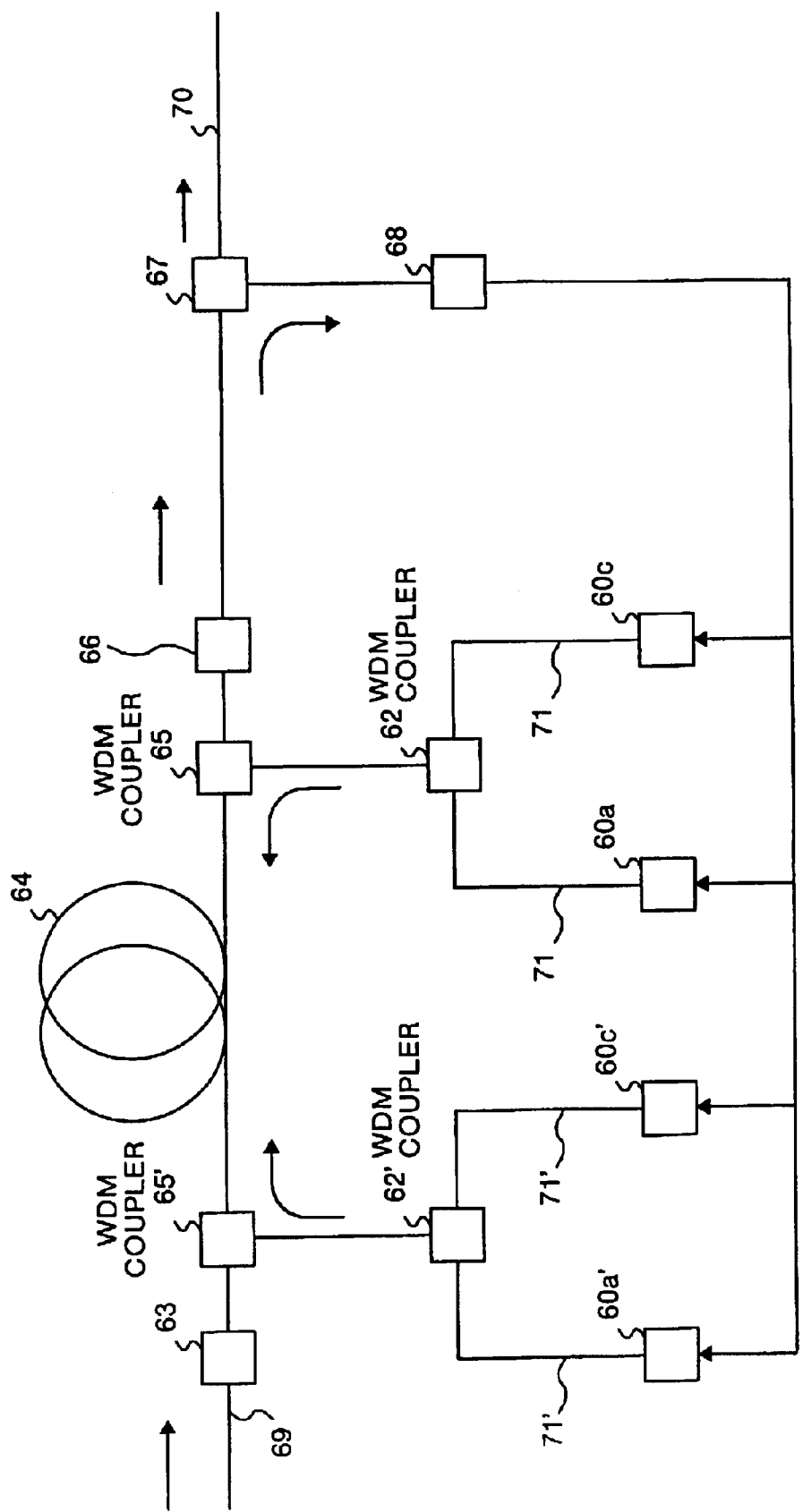
FIG. 20 is a block diagram which shows an application example of the Raman amplifier shown in FIG. 19.

Similarly, FIG. 20 is a block diagram which shows the construction of a Raman amplifier employing the bi-directional excitation system. In the Raman amplifier shown in FIG. 19, the WDM coupler 65', the semiconductor laser modules 60*a*' and 60*c*', and the WDM coupler 62' shown in FIG. 18 are further provided, in the Raman amplifier shown in FIG. 16, thereby carrying out the backward pumping and forward pumping. In this instance, the semiconductor laser modules 60*a*' and 60*c*' use the semiconductor laser devices used in the first to the fourth embodiments, and hence the RIN can be reduced, and the forward pumping can be effectively carried out.

Figure 21:
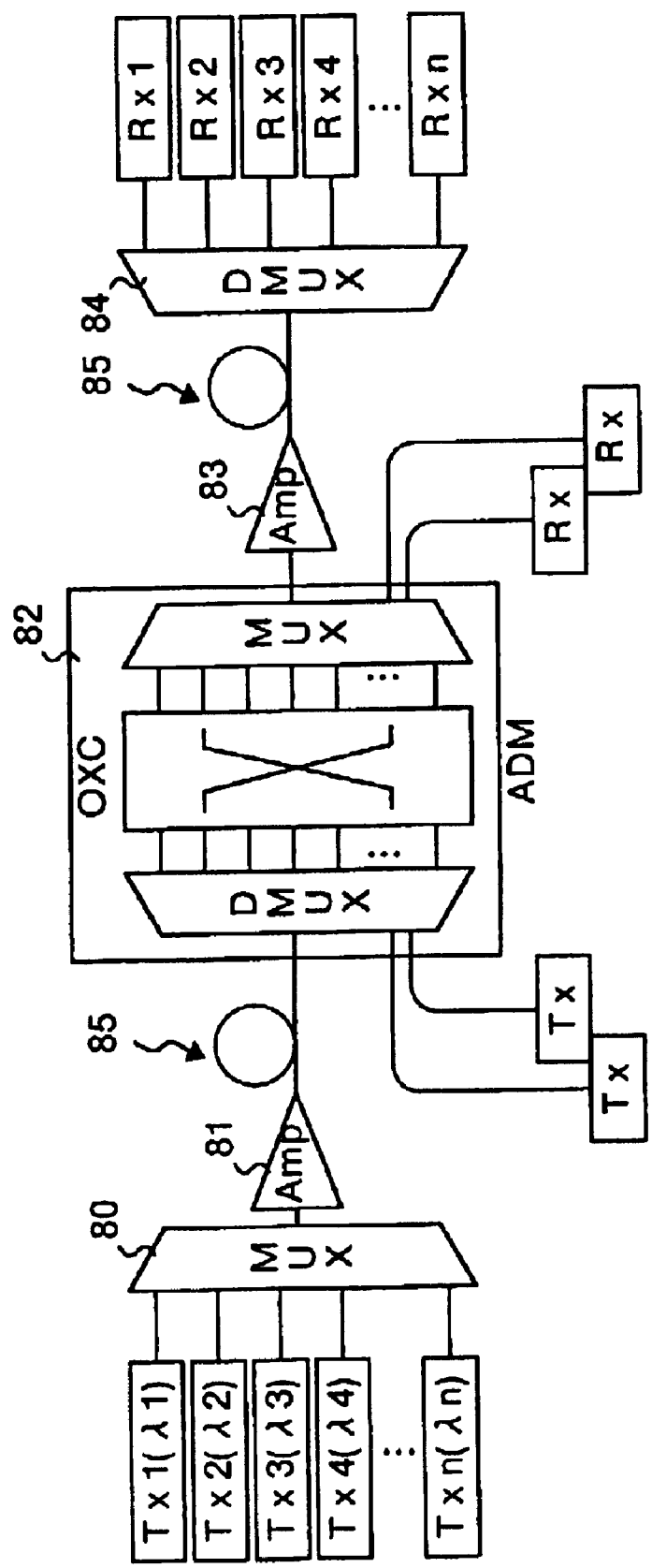
FIG. 21 is a block diagram which shows the schematic construction of the WDM communication system using the Raman amplifier shown in FIG. 15 to FIG. 20.

As described above, the Raman amplifier shown in FIG. 17 to FIG. 20 can be applied to the WDM communication system. FIG. 21 is a block diagram which shows the schematic construction of the WDM communication system to which the Raman amplifier shown in FIG. 17 to FIG. 20 is applied.

In FIG. 21, optical signals having wavelengths $\lambda_1$ to $\lambda_n$ transmitted from a plurality of transmitters Tx1 to Txn are coupled by an optical coupler 80 and aggregated into one optical fiber 85. On a transmitting path of this optical fiber 85, a plurality of Raman amplifiers 81 and 83 corresponding to the Raman amplifier shown in FIG. 17 to FIG. 20 are disposed depending on the distance, so that the attenuated optical signal is amplified. The signal transmitted on the optical fiber 85 is branched into optical signals having the plurality of wavelengths $\lambda_1$ to $\lambda_n$, and received by a plurality of receivers Rx1 to Rxn. An ADM (Add/Drop Multiplexer) which adds or drops an optical signal having an optional wavelength may be inserted in the optical fiber 85.

In the above third embodiment, the semiconductor laser device shown in the first embodiment or the semiconductor laser module shown in the second embodiment is used as an excitation light source for the Raman amplification. However, the invention is not limited thereto, and it is obvious that the device and the module can be also used as the EDFA excitation light source of for example 980 nm and 1480 nm.

As explained above, according to one aspect of the present invention, the diffraction grating is partially provided in the vicinity of the active layer formed between the first reflection coating provided on the radiation end face of a laser beam and the second reflection coating provided on the reflection end face of the laser beam. There is also formed the non-current injection area in which when a laser beam having a desired oscillation longitudinal mode is output by the wavelength selection characteristic at least by the diffraction grating, the injected current to the vicinity of the periphery including the diffraction grating is suppressed, and the current blocking layer is provided at a position corresponding to the upper part of the diffraction grating, and between the contact layer provided in the upper layer of the upper cladding layer which confines the light in the active layer and the electrode to which the injected current is applied, which blocks the current directed from the electrode towards the diffraction grating, with respect to the upper cladding layer. A diffusion prevention layer which suppresses alloying between the current blocking layer and the electrode is also provided between the current blocking layer and the electrode, so that at the time of heat treatment which alloys between the contact layer and the electrode, the progress of alloying occurring between the current blocking layer and the electrode is reliably prevented from reaching an interface between the current blocking layer and the contact layer, a temperature rise in the vicinity of the diffraction grating is suppressed, and fine fluctuations do not occur in the monitor current with respect to a change in the optical output. As a result, even in the instance of a high-output semiconductor laser device, there is the effect that the monitor current with respect to the optical output becomes stable, thereby enabling simple and easy optical amplification control.

According to another aspect of the present invention, when an n-type semiconductor substrate is used, the current blocking layer is made of n-InP, and the diffusion prevention layer is made of n-InGaAsP, p-InGaAsP or genuine InGaAsP which is substantially lattice-matched with the current blocking layer, so that the non-current injection area can be reliably realized. As a result, even in the instance of a high-output semiconductor laser device, there is the effect that the monitor current with respect to the optical output becomes stable, thereby enabling simple and easy optical amplification control.

According to still another aspect of the present invention, when a p-type semiconductor substrate is used, the current blocking layer is made of p-InP, and the diffusion prevention layer is made of n-InGaAsP, p-InGaAsP or genuine InGaAsP which is substantially lattice-matched with the current blocking layer, so that the non-current injection area can be reliably realized. As a result, even in the instance of a high-output semiconductor laser device, there is the effect that the monitor current with respect to the optical output becomes stable, thereby enabling simple and easy optical amplification control.

According to still another aspect of the present invention, the diffraction grating is provided on the first reflection coating side or in the vicinity of the first reflection coating, so as to have a function for wavelength selection of the oscillation wavelength and a function as a radiation side reflection plane of a resonator, as well as reliably suppressing injection of current to the vicinity of the diffraction grating, to thereby output a laser beam of a desired oscillation longitudinal mode. As a result, there is the effect that the monitor current with respect to the optical output becomes stable, and even in the instance of a high-output semiconductor laser device, optical amplification control becomes simple and easy, and it can be expected to decrease the probability of an end face deterioration which occurs on the end face on the first reflection coating side in the active layer.

According to still another aspect of the present invention, the diffraction grating is provided on the second reflection coating side or in the vicinity of the second reflection coating, so as to have a function for wavelength selection of the oscillation wavelength and a function as a rear side reflection plane of a resonator, as well as reliably suppressing injection of current to the vicinity of the diffraction grating, to thereby output a laser beam of a desired oscillation longitudinal mode. As a result, there is the effect that the monitor current with respect to the optical output becomes stable, and even in the instance of a high-output semiconductor laser device, optical amplification control becomes simple and easy, and it can be expected to decrease the probability of end face deterioration which occurs on the end face on the second reflection coating side in the active layer.

According to still another aspect of the present invention, the diffraction grating is provided on the first reflection coating side or in the vicinity of the first reflection coating, and on the second reflection coating side or in the vicinity of the second reflection coating, so as to have a function of wavelength selection of the oscillation wavelength and a function as a radiation side reflection plane and a rear side reflection plane of a resonator, as well as reliably suppressing injection of current to the vicinity of the diffraction grating, to thereby output a laser beam of a desired oscillation longitudinal mode. As a result, there is the effect that the monitor current with respect to the optical output becomes stable, and even in the instance of a high-output semiconductor laser device, optical amplification control becomes simple and easy, and it can be expected to decrease the probability of end face deterioration which occurs on the end face on the first reflection coating side and the second reflection coating side in the active layer.

According to still another aspect of the present invention, in accordance with the wavelength selection characteristic of the diffraction grating, the number of the desired oscillation longitudinal modes included in the half bandwidth of the oscillation wavelength spectrum is at least two, so as to output a high-output laser beam. As a result, there is the effect that the monitor current with respect to the optical output becomes stable, and even in the instance of a high-output semiconductor laser device, optical amplification control becomes simple and easy, and particularly, a semiconductor laser device suitable for an excitation light source for Raman amplification, in which high output is required, can be realized.

According to still another aspect of the present invention, the length of the diffraction grating provided on the first reflection coating side is made not larger than 300 $\mu$m. As a result, there is the effect that the oscillation longitudinal modes of at least two can be easily generated, and the efficiency of the optical output can be improved.

According to still another aspect of the present invention, the length of the diffraction grating provided on the first reflection coating side is made not larger than a value of (300/1300) times of the resonator length. As a result, there is the effect that the oscillation longitudinal modes of at least two can be easily generated with respect to an optional oscillation wavelength, and the efficiency of a high-output optical output can be improved.

According to still another aspect of the present invention, the diffraction grating has a multiplication value of 0.3 or less obtained by multiplying a coupling coefficient of the diffraction grating by the diffraction grating length, so that the linearity of the driving current-optical output characteristic is improved, and the stability of the optical output can be enhanced. As a result, there is the effect that the driving current dependency of the oscillation wavelength can be further reduced, and a semiconductor laser device having high output stability can be realized.

According to still another aspect of the present invention, the grating cycle of the diffraction grating is changed at random or with a predetermined cycle, so that fluctuations are caused in the wavelength selection of the diffraction grating to there by expand the half bandwidth of the oscillation wavelength spectrum. As a result, there is the effect that the number of oscillation longitudinal modes included in the half bandwidth of the oscillation wavelength spectrum can be easily increased, and a stable and highly efficient semiconductor laser device can be realized.

According to still another aspect of the present invention, the length of the resonator formed by the active layer formed between the first reflection coating and the second reflection coating is made not smaller than 800 μm, so as to enable high-output operation. As a result, there is the effect that a semiconductor laser device having high-output operation in which the monitor current with respect to the optical output becomes stable, and optical amplification control becomes simple and easy can be realized.

According to still another aspect of the present invention, since a semiconductor laser device which does not use a fiber grating is used so that the resonator of the semiconductor laser device is not physically separated, alignment of the optical axis is not necessary. Hence, assembly of the semiconductor laser module becomes easy, and the oscillation characteristic of the laser hardly changes due to mechanical vibrations. As a result, a semiconductor laser module which can output a stable laser beam reliably and stably can be realized.

According to still another aspect of the present invention, since a semiconductor laser device which does not use a fiber grating is used so that the resonator of the semiconductor laser device is not physically separated, alignment of the optical axis is not necessary. Hence, assembly of the semiconductor laser module becomes easy, and the oscillation characteristic of the laser hardly changes due to mechanical vibrations. As a result, a semiconductor laser module which can output a stable laser beam reliably and stably can be realized.

According to still another aspect of the present invention, the above-described semiconductor laser device or the above-described semiconductor laser module is used as an excitation light source for broadband Raman amplification, so that the operation and effect of the semiconductor laser devices or the semiconductor laser module described above can be exerted. As a result, there is the effect that stable and high gain Raman amplification can be performed.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
an active layer configured to radiate light in the presence of an injection current;
a first reflection coating positioned on a first side of said active layer;
a second reflection coating positioned on a second side of said active layer thereby forming a resonator between said first reflection coating and said second reflection coating;
a partial diffraction grating positioned within said resonator along a portion of the length of said active layer;
a non-current injection area formed along said diffraction grating so as to suppress injection current in said portion of the length of the active layer; and
a diffusion prevention layer positioned between said non-current injection area and an electrode and configured to suppress alloying between said non-current injection area and said electrode.

2. The semiconductor laser device of claim 1, wherein said semiconductor laser device is formed on an n-type semiconductor substrate;
said non-current injection area is n-InP; and
said diffusion prevention layer is n-InGaAsP, p-InGaAsP or genuine InGaAsP.

3. The semiconductor laser device of claim 1, wherein said semiconductor laser device is formed on a p-type semiconductor substrate;
said non-current injection area is p-InP; and
said diffusion prevention layer is n-InGaAsP, p-InGaAsP or genuine InGaAsP.

4. The semiconductor laser device of claim 1, wherein said partial diffraction grating is positioned on a light emission side of said resonator.

5. The semiconductor laser device of claim 4, wherein the product of a coupling coefficient and the length of the diffraction grating is 0.3 or less.

6. The semiconductor laser device of claim 1, wherein said partial diffraction grating is positioned on a light reflection side of said resonator.

7. The semiconductor laser device of claim 1, wherein said partial diffraction grating is positioned on said light emission side of said resonator, and on said light reflection side of said resonator.

8. The semiconductor laser device of claim 1, wherein the number of oscillation longitudinal modes included in the half bandwidth of the oscillation wavelength spectrum is at least two.

9. The semiconductor laser device of claim 1, wherein the diffraction grating has a length of not larger than 300 μm.

10. The semiconductor laser device of claim 1, wherein a length of the diffraction grating is not larger than a value of (300/1300) times of the resonator length.

11. The semiconductor laser device of claim 1, wherein the grating cycle of the diffraction grating is changed at random or with a predetermined cycle.

12. The semiconductor laser device of claim 1, wherein the length of the resonator formed by the active layer formed between said first reflection coating and said second reflection coating is not smaller than 800 μm.

13. A semiconductor laser module comprising:
a semiconductor laser including:
an active layer configured to radiate light in the presence of an injection current;
a first reflection coating positioned on a first side of said active layer;
a second reflection coating positioned on a second side of said active layer thereby forming a resonator between said first reflection coating and said second reflection coating;
a partial diffraction grating positioned within said resonator along a portion of the length of said active layer;
a non-current injection area formed along said diffraction grating so as to suppress injection current in said portion of the length of the active layer;
a diffusion prevention layer positioned between said non-current injection area and an electrode; and configured to suppress alloying between said non-current injection area and said electrode;
an optical fiber configured to guide the laser beam emitted from said semiconductor laser device to the outside; and an optical coupling lens system configured to optically couple said semiconductor laser device and the optical fiber.

14. The semiconductor laser module of claim 13, further comprising:

a temperature control device configured to control the temperature of said semiconductor laser device; and an isolator arranged in said optical coupling lens system and configured to suppress incidence of a reflected return light from the optical fiber side.

15. An optical fiber amplifier comprising:

an excitation light source including a semiconductor laser device said semiconductor laser module having:

an active layer configured to radiate light in the presence of an injection current;

a first reflection coating positioned on a first side of said active layer;

a second reflection coating positioned on a second side of said active layer thereby forming a resonator between said first reflection coating and said second reflection coating;

a partial diffraction grating positioned within said resonator along a portion of the length of said active layer;

a non-current injection area formed along said diffraction grating so as to suppress injection current in said portion of the length of the active layer; and a diffusion prevention layer positioned between said non-current injection area and an electrode and configured to suppress alloying between said non-current injection area and said electrode.

16. A Raman amplifier comprising:

an excitation light source including a semiconductor laser module, said semiconductor laser module having:

an active layer configured to radiate light in the presence of an injection current;

a first reflection coating positioned on a first side of said active layer;

a second reflection coating positioned on a second side of said active layer thereby forming a resonator between said first reflection coating and said second reflection coating;

a partial diffraction grating positioned within said resonator along a portion of the length of said active layer;

a non-current injection area formed along said diffraction grating so as to suppress injection current in said portion of the length of the active layer;

a diffusion prevention layer positioned between said non-current injection area and an electrode and configured to suppress alloying between said non-current injection area and said electrode;

an optical fiber configured to guide the laser beam emitted from said semiconductor laser device to the outside; and an optical coupling lens system configured to optically couple said semiconductor laser device and the optical fiber.

17. The Raman amplifier of claim 16, wherein said semiconductor laser device is coupled to said fiber at an input side of said fiber such that said light beam is applied in a forward pumping method.

18. The Raman amplifier of claim 16, wherein said semiconductor laser device is coupled to said fiber at an output side of said fiber such that said light beam is applied in a backward pumping method.

19. The Raman amplifier of claim 16, wherein said semiconductor laser device is coupled to said fiber at both an input and output side of said fiber such that said light beam is applied in both a forward and backward pumping method.

20. A method of manufacturing a semiconductor device comprising:

forming an active layer for radiating light in the presence of an injection current;

forming a first reflection coating on a first side of said active layer and a second reflection coating on a second side of said active layer thereby to form a resonator therebetween;

forming a partial diffraction grating within said resonator along a portion of the length of said active layer;

forming a non-current injection area along said diffraction grating for suppressing the injection current in said portion of the length of the active layer;

forming an electrode for supplying the injection current to said active layer; and forming a diffusion prevention layer between said non-current injection area and an electrode for suppressing alloying between said non-current injection area and said electrode.

* * * * *

UNITED STATES PATENT AND TRADEMARK OFFICE
CERTIFICATE OF CORRECTION

PATENT NO. : 6,898,228 B2
DATED : May 24, 2005
INVENTOR(S) : Irino et al.

It is certified that error appears in the above-identified patent and that said Letters Patent is hereby corrected as shown below:

<u>Title page,</u>
Insert Item -- [45] **Date of Patent:   \*May 24, 2005**
[\*] Notice: Subject to any disclaimer, the term of this patent is extended or adjusted under 35 U.S.C. 154(b) by 253 days.
This Patent is subject to a terminal disclaimer. --

Signed and Sealed this

Ninth Day of August, 2005

JON W. DUDAS
*Director of the United States Patent and Trademark Office*